US 6,410,923 B1

(12) United States Patent
Crewe

(10) Patent No.: US 6,410,923 B1
(45) Date of Patent: Jun. 25, 2002

(54) MAGNETIC LENS APPARATUS FOR USE IN HIGH-RESOLUTION SCANNING ELECTRON MICROSCOPES AND LITHOGRAPHIC PROCESSES

(75) Inventor: Albert V. Crewe, Dune Acres, IN (US)

(73) Assignee: Arch Development Corporation, Chicago, IL (US)

(*) Notice: Subject to any disclaimer, the term of this patent is extended or adjusted under 35 U.S.C. 154(b) by 0 days.

(21) Appl. No.: 09/550,945

(22) Filed: Apr. 17, 2000

Related U.S. Application Data

(63) Continuation of application No. 08/973,706, filed on Mar. 9, 1998, now Pat. No. 6,051,839.

(30) Foreign Application Priority Data

Jun. 7, 1996 (WO) .............................. PCT/US96/09906

(51) Int. Cl.⁷ .......................... H01J 37/143; H01J 37/28
(52) U.S. Cl. .............................. 250/396 ML; 250/310; 250/398
(58) Field of Search .......................... 250/396 ML, 310, 250/311, 396 R, 398

(56) References Cited

U.S. PATENT DOCUMENTS

| | | | |
|---|---|---|---|
| 3,417,224 A | 12/1968 | Steigerwald et al. | 219/121 |
| 3,587,013 A | 6/1971 | Dietrich et al. | 335/210 |
| 3,870,891 A | 3/1975 | Mulvey | 250/398 |
| 3,916,201 A | 10/1975 | Herrmann et al. | 250/396 |
| 4,214,166 A | 7/1980 | Dietrich et al. | 250/396 |
| 4,232,283 A * | 11/1980 | Werst | 335/212 |
| 4,315,152 A * | 2/1982 | Smith | 250/396 ML |
| 4,810,879 A | 3/1989 | Walker | 250/305 |
| 4,810,880 A | 3/1989 | Gerlach | 250/305 |
| 4,928,010 A | 5/1990 | Saito et al. | 250/310 |
| 5,149,967 A * | 9/1992 | Otaka | 250/396 ML |
| 6,104,034 A * | 8/2000 | Frosien et al. | 250/396 ML |

OTHER PUBLICATIONS

Hordon et al., "Limits of Low–Energy Electron Optics," *Journal of Vacuum Science and Technology*, 11:2300–2303, 1993.

Nakagawa et al., "A Novel High–Resolution Scanning Electron Microscope for the Surface Analysis of High–Aspect–Ratio Three Dimensional Structures," *Japanese Journal of Applied Physics*, 30(9A, Part 1):2113–2116, 1991.

* cited by examiner

Primary Examiner—Bruce Anderson
(74) Attorney, Agent, or Firm—Fulbright & Jaworski L.L.P.

(57) ABSTRACT

Disclosed are lens apparatus in which a beam of charged particles is brought to a focus by means of a magnetic field, the lens being situated behind the target position. In illustrative embodiments, a lens apparatus is employed in a scanning electron microscope as the sole lens for high-resolution focusing of an electron beam, and in particular, an electron beam having an accelerating voltage of from about 10 to about 30,000 V. In one embodiment, the lens apparatus comprises an electrically-conducting coil arranged around the axis of the beam and a magnetic pole piece extending along the axis of the beam at least within the space surrounded by the coil. In other embodiments, the lens apparatus comprises a magnetic dipole or virtual magnetic monopole fabricated from a variety of materials, including permanent magnets, superconducting coils, and magnetizable spheres and needles contained within an energy-conducting coil. Multiple-array lens apparatus are also disclosed for simultaneous and/or consecutive imaging of multiple images on single or multiple specimens. The invention further provides apparatus, methods, and devices useful in focusing charged particle beams for lithographic processes.

53 Claims, 13 Drawing Sheets

MAGNETIC LENS APPARATUS FOR USE IN HIGH-RESOLUTION SCANNING ELECTRON MICROSCOPES AND LITHOGRAPHIC PROCESSES

This is a continuation of application Ser. No. 08/973,706, filed Mar. 9, 1998 U.S. Pat. No. 6,051.839.

1. BACKGROUND OF THE INVENTION

1.1 Field of the Invention

The present invention relates to magnetic lens apparatus comprising magnetic monopoles or magnetic dipoles useful for focusing a beam of charged particles, such as electrons, onto a target in front of the lens. More particularly, the invention concerns magnetic lenses which may be positioned below the specimen in a scanning electron microscope, which have magnetic field strengths on the order of between about 0.5 and 10 Tesla. Disclosed are lenses optimized for high-resolution focusing of an electron beam having an accelerating voltage of between about 10 and about 50,000 V. In a preferred embodiment, the lens apparatus disclosed herein provide the sole focusing lens for a low-voltage (10 to 10,000 V) high-resolution scanning electron microscope. Alternative embodiments employing superconducting coil technologies for producing a magnetic field in such lens apparatus are also disclosed as are methods for their use in variable-probe lithographic etching processes.

1.2 Description of the Related Art

1.2.1 Electron Microscopy

The scanning electron microscope (SEM) is the instrument of choice for the investigation of irregular surfaces both in biology materials sciences and the semiconductor industry. The SEM forms an image by focusing an electron probe onto the surface of the specimen and the image contrast is formed using the secondary electrons or the high energy backscattered electrons which are generated at or near to the surface. Since the depth of focus may be quite large there is no penalty to be paid for deep indentations or sharp projections and as a result the SEM has been used very effectively for the study of such diverse specimens as the surface of cell membranes or semiconductor circuits.

The normal form of the SEM is an instrument which uses electrons of around 30 kV to form the probe. The reason for this choice of voltages is that it is in this range where the electron probe can take on dimensions of relevance to the investigations of these various specimens. Probes can be formed with dimensions of the order of about 0.5 nm, producing effective resolutions in the range of about 0.7 nm.

It should also be noted that these very high resolving powers have been obtained by inserting the specimen inside the magnetic field of the lens which forms the probe and for best operation the specimen is placed at the point of maximum magnetic field at the center of the lens. The maximum magnetic field which is attainable with conventional materials is about 2 or 2.5 T and it is this which limits the focal length which can be obtained with these lenses and in turn it is the focal length which determines the aberration coefficients of the lens.

1.2.2 Unsuitability of High-Voltage Electrons for Delicate Specimens

Unfortunately, there is a penalty to be paid for using high voltage electrons, particularly when biological or other fragile specimens are examined. Such electrons penetrate deeply into specimens of these types to a distance on the order of a micron or two and yet the secondary electrons which form the image are generated only within the top 2 nm or so of the specimen. The consequence of this is that although the probe is small and high resolution can be obtained, the majority of the electrons penetrate deeply into the specimen and cause substantial damage. In the case of biological materials this can cause significant mass loss and even collapse of the specimen. In the case of semiconductors it has the consequence that the area that is being investigated can no longer be used in a working circuit.

1.2.3 Limitations of Conventional Magnetic Lenses

Focusing a beam of charged particles, e.g., electrons, by causing it to pass axially through a magnetic field of symmetrical distribution produced by a current-carrying coil positioned around the beam is well known in the mechanical arts. The focusing of charged particle beams, and particularly electron beams, is of paramount important in the illuminating systems of scanning- and transmission-type electron microscopes, and in electron probe X-ray micro-analysis apparatus.

In each of these apparatus, and particularly in the case of scanning electron microscopes (SEMs) and micro-analysis devices, a critical aspect of the lens is its ability to focus the electron beam on a small target area. Such a requirement has demanded that the resolutions of SEM lenses be of the highest possible order, and that chromatic and spherical aberrations of the lens be of the lowest possible order.

Conventional magnetic lenses which are used in these forms of apparatus are positioned about the path of the beam and may occupy a considerable distance along the beam. Such lenses so positioned can impose undesirable structural and design limitations on the apparatus in which they are used. One such example is illustrated in U.S. Pat. No. 4,419,581 to Nakagawa (specifically incorporated herein by reference). While an improvement over earlier designs, the size, shape, and above-stage configuration of the lens apparatus made it unsuitable for analysis of large specimens such as semiconductor wafers or low-voltage analysis of biological specimens.

Subsequent improvements in electron optic lens systems have been marginal. For example, the magnetic condenser lens system described in U.S. Pat. No. 5,241,176 to Yonezawa (specifically incorporated herein by reference), while employing conical lenses and tapered pole pieces to reduce the distance between the objective lens and the sample, still was an above-stage lens, and the improvement in resolving power over conventional SEM lenses was only about 50%.

Another limitation of these prior art lenses, was that all were closely positioned around the electron beam so that a very powerful pumping system was required to maintain the desired vacuum conditions within the constricted passageways (Mulvey, 1975).

1.2.4 Conventional Above-Specimen Lens Designs Limit SEM

Cylindrically symmetric magnetic fields are in general use for focusing beams of charged particles. These fields are usually near Gaussian in shape and the focus can be inside or outside the strong field region, but virtually any shape will suffice since the focusing only depends upon the square of the field strength. The advantages and disadvantages of any particular choice of field distribution are reflected in three significant electron optical parameters: The focal length f, the coefficient of spherical aberration $C_s$ and the coefficient of chromatic aberration $C_c$. It is these three numbers which determine the size of the focused probe.

In practice, there are many other considerations which determine the final choice of field shape, among the most important being the size and position of the pole pieces of the lens itself since they may permit or obstruct access to the region around the focus and this may become a serious issue in the case of large specimens and a substantial degree of specimen tilt. For this reason, it is desirable to create alternative lens designs which would provide superior improvements over conventional lens designs, and substantially further the fields of electron microscopy and related applications such as the use of lens apparatus in lithographic processes.

In conventional SEMs, the focusing lens is located between the source and the specimen (the focus) or alternatively the focus occurs inside the lens (e.g., see U.S. Pat. No. 5,241,176 to Yonezawa). The former allows for a substantial working distance at the expense of large values of the three parameters while the latter offers the smallest parameter values at the expense of strict constraints on specimen size.

Although magnetic lens systems have been described which have a conducting coil positioned behind the target position with respect to the beam of particles in order to overcome such mechanical difficulties, these lenses were never commercially available for use in SEMs. One such system was described in U.S. Pat. No. 3,870,891 to Mulvey (specifically incorporated herein by reference). While the configuration of the Mulvey lens provided an improvement over the conventional magnetic lens systems of contemporary SEMs, it was not considered for high-resolution focusing of low-voltage particle beams.

1.3 Deficiencies in the Prior Art

A major limitation of conventional lenses is that they typically have two sets of pole pieces, one above the specimen and one below. The specimen must be placed in this confined space and therefore the separation between the two sets of pole pieces must be of the order of several millimeters. This mechanical limitation significantly restricts the focal length to something of the order of a millimeter or two.

In the conventional design of magnetic lenses it is impossible to achieve the focal length required for very high resolutions and the reason for that is a simple mechanical one. The specimen must be placed in the magnetic field and it must be held in some form of mechanical device which allows for translation and perhaps rotation and tilt of the specimen. These mechanical requirements place a restriction on the smallest dimensions which the lens could have and it is virtually impossible to reduce the size of these mechanical components any further. It is for these and other reasons that there currently is a need in the art for lens apparatus which are capable of high-resolution focusing of a beam of charged particles, and in particular, a low-voltage beam of electrons for examination of specimens in an SEM. The uses for such lens apparatus would not be restricted to use in electron microscopy, but also provide significant improvement in the quality and resolution of etching probes in lithographic processes.

The creation of such a lens apparatus, and in particular lenses employing superconducting coils would providing substantial improvement in the resolving power of contemporary magnetic lenses, and also permit for the first time, high-resolution focusing of low-voltage particle beams. The use of magnetic monopoles and magnetic dipoles in combination with superconducting coils would represent a breakthrough in magnetic lens technology and greatly advance the fields of scanning electron microscopy (particularly in the analysis of biological and other delicate specimens such as semiconductor wafers and related computer devices for which low-voltage beam analyses are tantamount) and lithography (particularly in the fabrication of multiple etching probes having varying probe diameters.

2. SUMMARY OF THE INVENTION

The present invention overcomes these and other limitations of the prior art by providing novel lens apparatus, which are placed below the specimen for use in scanning electron microscopes, to highly-resolve beams of charged particles, and particularly, low-voltage electrons. This configuration permits the use of large specimens together with small parameter values, and significantly overcomes the limitation of conventional SEMs in which the lens apparatus are placed above-the specimen. The lens designs disclosed herein also provide for the first time the ability to create multiple lens arrays for use in a single electron microscope. Such arrays permit the simultaneous or consecutive imaging of multiple specimens or multiple locations on a single specimen such as semiconductor wafers.

The disclosed lens apparatus and lens arrays also find utility in the field of lithography by providing multiple etching probes, the coil strengths of which may be individually controlled to produce multiple probes having varying probe diameters and beam voltages. Electronic optics devices for electron beam lithography are well-known in the art. One such device is exemplified in U.S. Pat. No. 4,918,318 to Chambost and Sonrier (specifically incorporated herein by reference) while another is exemplified in U.S. Pat. No. 4,392,058 to Smith (also specifically incorporated herein by reference).

In one aspect of the present invention, a lens design is provided which uses a magnetic dipole which is coaxial with the beam of charged particles. It is already well known that a magnetic dipole can focus charged particles because the earth is such a dipole and particles from the sun are focused near the poles, creating the auroral displays. Mulvey previously considered the use of magnetic dipoles in his treatise on the general theory of electron focusing (Mulvey, 1982). It was noted in the case of transmission microscopes that dipole lenses offered the possibility of reducing the physical size of electromagnetic lenses, a factor of considerable value in high voltage electron microscopes, although no specific lens designs were formulated. It was postulated that such lenses would have smaller aberration coefficients than conventional lenses, however the design of dipole lenses for transmission microscopes is somewhat compromised by the need to provide a hole in the pole piece for the passage of the electron beam. The presence of the hole limits the maximum field strength and this in turn sets a lower limit on the focal length.

In sharp contrast, the inventor has demonstrated that many of these considerations change when one considers the use of dipole lenses for a scanning electron microscope, and in particular, the low-voltage SEM. For this application there is no need to provide a penetration through the iron and one may fully utilize the properties of the magnetic material.

To place the original theories of Mulvey in a practical and more universal context, the inventor has related lens properties to the dipole moment in fabricating lens apparatus based on a magnetic dipole. Alternatively, monopole fields have also been demonstrated by the inventor to be useful in the fabrication of magnetic lens designs disclosed herein. In one such embodiment, a magnetizable needle is surrounded by an energized coil. The present invention seeks to overcome these and other inherent limitations of the prior art by providing a lens apparatus capable of the high-resolution focusing of a beam of low-voltage charged particles. In a preferred embodiment, such a lens apparatus is employed in a low-voltage, high-resolution scanning electron microscope. In an alternate embodiment, lenses of the present invention are employed for the focusing of charged particles as etching probes for use in lithographic processes.

2.1 Solid Pole-Piece Lens Apparatus

Turning firstly to the lens apparatus and their uses in an electron microscope, the present invention contemplates lens apparatus adapted for use in a device for focusing a beam of charged particles having an accelerating voltage of from about 100 to about 30,000 V. In one embodiment, the lens generally comprises a solid pole piece for focusing the beam of charged particles and an electrically-conducting coil positioned axially around the pole piece to energize the pole piece and produce a magnetic field. The pole piece and coil are positioned within a yoke of soft iron or cold roll steel, or other suitable material which has a high magnetic permeability.

The pole piece is preferably about 0.5 mm to about 4 mm in diameter, with 1 to 3 mm in diameter being more preferred and pole pieces of about 1 mm, 2 mm, or 3 mm being highly preferred. The pole piece may be fabricated of soft iron, holmium metal, or some other suitable material having a high magnetic permeability. The entire lens assembly is positioned below the specimen on the side opposite to the one on which the incident electron beam impinges.

The magnetic lens comprises an electrically-conducting wire coil arranged around the longest axis of a pole piece which is composed of a material having a high magnetic permeability which extends along said axis within the space surrounded by the coil. The term "electrically-conducting wire coil" includes a single coil or a plurality of coils electrically connected so that, when suitably energized, will produce the magnetic field required to focus the beam onto the target.

Preferably the coil is annular and the magnetic pole piece is of annular cross-section. The pole piece may lie partially or wholly within the space surrounded by the coil and in a preferred embodiment it extends the entire length of the coil and extends from the end of the coil. The cross-sectional area of the pole piece is preferably as large as the dimensions of the coil will allow. Optionally at least part of the pole piece extending from the end of the is conical or slightly rounded, or tapers in the direction of the source of charged particles.

The pole piece may be formed into a nose-piece configuration and project beyond the side of the wire coil facing the source of charged particles. It may be shaped symmetrically about the axis of the beam of charged particles to induce a magnetic field configuration required for focusing the beam of charged particles in a desired manner. Such a magnetic field configuration may for example demand a high localized flux density and it will be recognized by a person skilled in the art that care must be exercised to ensure that the magnetic material of the pole piece is not unnecessarily driven into saturation in such a situation. If it is found to be necessary, the pole piece may be tapered or stepped along its length to overcome problems of saturation. This may be required, for example, if the snout projects a considerable distance beyond the side of the coil facing the source of charged particles. The coil is fashioned of copper or other suitable wire and may be cooled by evaporation, radiation, or by water cooling.

In one embodiment, a holder may be fixedly mounted onto the end of the pole piece perpendicular to the longest axis of the pole piece for the purpose of serving as a specimen stage. Both the pole piece and the pole piece-specimen holder unit may be coated with a thin film of carbon or other suitable material to reduce background radiation caused by electrons impinging directly onto the specimen holder and/or pole piece.

The accelerating voltage of the beam of charged particles is preferably from about 100 to about 30,000 V, and more preferably from about 500 to about 10,000 V. In particular embodiments, the accelerating voltage of the electron beam is from about 1,000 to about 3,000 V, and from about 2,000 to about 2,500 V. Of course, the accelerating voltage may be any practical voltage within this range, e.g., 100 V, 200 V, 300 V, 400 V, 500 V, 600 V, 700 V, 800 V, 900 V, 910 V, 920 V, 930 V, 950 V, 975 V, etc., even up to an including voltages of 2,000 V; 3,000 V; 4,000 V; 5,000 V; 9,000 V; and the like. Of course, in instances where either higher or lower accelerating voltages are desired, one of skill in the art will be able to readily adjust the voltage of the accelerating particles to any such desired voltage.

The lens apparatus of the present invention may be used in a device to provide substantially the only means for focusing a beam of charged particles onto a target position between the source and the lens. The lens apparatus may be used to focus a beam of electrons, and is particularly useful in focusing a beam of electrons in an electron microscope. Preferably the device is a transmission or scanning electron microscope, and most preferably, the microscope is a scanning electron microscope.

In certain embodiments a device in accordance with the present invention may comprise two or more lens apparatus. This plurality of lenses may be used to simultaneously image one or more specimens, or may be used to consecutively image one or more specimens. The lenses may be arranged in any given arrangement that is practical within the confines of the device employing the lenses, and owing to the small size of the lenses, multiple lens arrays having about 3, 4, 5, or more lenses are contemplated. A particular advantage of the present lens design is the ability to fabricate small columns. With this design, multiple columns and multiple probes may be combined into a single apparatus to examine multiple specimens simultaneously. One example where this multi-lens array finds particular use is in the examination of identical semiconductor devices on a single silicon wafer, or the analysis of multiple regions of a particular biological specimen either simultaneously or consecutively.

Another aspect of the present invention is a method of focusing a beam of charged particles to a high degree of resolution. Preferably the degree of resolution is on the order of about 0.5 to about 2 nm. Preferably the accelerating voltage is between about 100 and about 30,000 V. Even more preferably, the accelerating voltage is between about 500 and about 10,000 V. The method generally involves providing a source of charged particles having an accelerating voltage of about 100 to about 30,000 V along a given axis, and focusing the beam with a magnetic field produced by one of the lens apparatus disclosed herein onto a target position on the axis between the source and the lens apparatus, with the lens apparatus being positioned on the side of the target position opposite to the source.

The single pole lens configuration of the present invention acts like a magnetic dipole such that the electrons are proceeding along the axis of the dipole and focus near to one of the poles. This is a very similar situation to one of the very first investigations in electron optics which was the one by Stormer who investigated the trajectories of high energy particles emitted by the sun and incident upon the earth.

If one imagines a single magnetic pole placed below the specimen with the electrons directed along the axis towards the specimen, then by adjusting the strength of that pole the electrons may be focused onto the specimen. For low voltage electrons, the advantages of the single pole lens are much more clearly evident. When using low voltage electrons it is possible to use a very high field strength at that single pole and thereby achieve a very small focal length. Because of the fact that there is little or no magnetic material above the specimen that whole region is left open and is available for the insertion of scanning coils and electron detectors. Additionally there is ample space for the mechanical devices which hold and manipulate the specimen itself.

By achieving a very small focal length it is possible to achieve a very high resolution because, as pointed out above, the coefficient of chromatic aberration is very closely equal to the focal length and as a result it is possible to come very much closer to the theoretical limit shown in FIG. 4 (Crewe, 1995).

2.2 Lens Apparatus Comprising a Magnetized Sphere

In an important embodiment, the present invention provides a lens apparatus comprising a permanent magnetic sphere as the sole means for focusing a beam of charged particles. The sphere is fabricated out of a magnetic material which is permanently magnetized along one diameter. Preferred materials include AlNiCo™ or any of rare-earth magnets such as samarium-cobalt and the like. Using such lens apparatus, magnetic field strengths of about 0.3 Tesla at the surface of a sphere are obtainable. Such field strength is quite adequate for focusing a beam of low energy electrons.

In another embodiment, the invention provides an array of magnetized spheres for focusing multiple electron beams either simultaneously or consecutively. In a preferred embodiment, alternate rows of spheres are arranged in a lattice array to have alternate polarities. For example, a row with a magnetic field pointing up next to a row with a magnetic field pointing down.

Permanent magnet dipoles may also consist of magnetized lenses having non-spherical geometries, and may be similarly fabricated to produce permanently-magnetized dipoles. An array of such magnetized spheres is shown in FIG. 6.

2.3 Lens Apparatus Comprising a Superconducting Coil

Another embodiment of the present invention is a lens apparatus which comprises a superconducting coil as the sole focusing lens for a beam of charged particles. In this particular embodiment, a magnetic dipole is fabricated from a superconducting coil, or alternatively, a circular loop of electric current. Particularly preferred superconducting materials include low-temperature superconductors such as $Nb_3Sm$, $Nb_3Ge$, and $Nb_{0.4}Ti_{0.6}$, or alternatively, high-temperature superconductors, such as $YBa_2Cu_3O_7$ and $Tl_2Ba_2Ca_2Cu_3O_{10}$, or related copper oxide superconductors may be used.

In the case of $Nb_3Sm$, $Nb_3Ge$, and $Nb_{0.4}Ti_{0.6}$ magnet coils, the superconductors are preferably cooled to liquid Helium temperatures (4.2 K). The inventor contemplates that coils made of these materials can generate magnetic fields up to and including field strengths of 10 T or more.

In the case of $YBa_2Cu_3O_7$, $Tl_2Ba_2Ca_2Cu_3O_{10}$, and other copper oxide superconductor magnet coils, the superconductors may be cooled to liquid nitrogen temperatures (77 K). Magnetic coils made of these materials can also generate magnetic fields up to and including field strengths of 10 T or more Superconductors prepared by either method may be made into coil configuration with two open ends for providing external current. Alternatively, donut-shaped closed rings may be fabricated with the rings being magnetized prior to use. When desirable, rings of differing sizes may be fabricated so as to provide coils of varying field strengths. One or more coils may be used in the practice of the invention according to the particular application.

A lens apparatus comprising a superconducting coil is shown in FIG. 7A and FIG. 7B. An array of such lens apparatus for focusing a plurality of charged particle beams is shown in FIG. 8A and FIG. 8B.

2.4 Lens Apparatus Comprising a Magnetizable Sphere Within an Energized Coil In another aspect, the invention also discloses a lens apparatus which comprises a magnetizable sphere within a coil. Such lenses may be used either singly, or alternatively, a plurality of such lenses may be used to simultaneously or consecutively focus a plurality of charged particle beams.

Such lens apparatus, which are based on a magnetic dipole, typically comprise a sphere of magnetic iron, Permadur, or alternatively soft iron, contained within an external magnetic field of lower strength. In a preferred embodiment, the magnetizable sphere is of about 1 mm in diameter and is placed in an about 1-cm diameter weak magnetic field.

A lens apparatus comprising an energized coil and a magnetizable sphere contained within said coil is shown in FIG. 9B. A lens array comprising a single energized coil and multiple magnetizable spheres useful for focusing a plurality of charged particle beams is shown in FIG. 10A and FIG. 10B. A lens array comprising a plurality of energized coils each containing one or more magnetizable spheres useful for focusing a plurality of charged particle beams is shown in FIG. 11A and FIG. 11B.

2.5 Lens Apparatus Comprising a Magnetizable Needle Within an Energized Coil Another aspect of the invention relates to a lens apparatus which comprises a magnetizable needle within an energizing coil. Such lenses are similar to those described above for a magnetic dipole lens apparatus. By employing a needle rather than a sphere within the energizing coil, a lens apparatus is achieved which comprises a near monopole field. The needle may be fabricated out of any suitable magnetizable material, such as those listed herein, in any convenient dimensions such that its length is considerably greater than its diameter. In preferred embodiments, the ratio of needle diameter to length is on the order of 1:10 or more. As in the case of the previous lens apparatus disclosed herein, the magnetizable needle contained within a conducting coil may also be used in the fabrication of multiple lens arrays. In one such embodiment, a single common magnetic field surrounds an array of needles inside the coil such that each one becomes a dipole and each one of them can then act as an independent lens for focusing electrons. Alternatively, multiple energizing coils may be employed in a lattice or lens array such that each coil comprises one or more magnetizable needles within.

A lens apparatus comprising an energized coil and a magnetizable needle contained within said coil is shown in FIG. 12A and FIG. 12B. A lens array comprising a single energized coil and multiple magnetizable needles useful for focusing a plurality of charged particle beams is shown in FIG. 13A and FIG. 13B. A lens array comprising a plurality of energized coils each containing one or more magnetizable needles useful for focusing a plurality of charged particle beams is shown in FIG. 14A and FIG. 14B.

2.6 Methods For the Use of Lens Apparatus in Lithographic Processes

In a preferred embodiment, the invention relates to the use of the disclosed lens apparatus in focusing a beam of charged particles, particularly electrons, resulting in an etching probe useful in lithographic processes. In particular embodiments, the lens apparatus comprises one or more superconducting coils within which one or more magnetizable spheres or needles may be placed in order to produce a focused etching probe. The size, diameter, and number of such coils, spheres, and/or needles may be varied as necessary to produce a plurality of focused beams. Such changes in the size of the spheres and/or needles will result in focusing particle beams to various dimensions, a desirable characteristic when a plurality of etching probes are desired having differing diameters and/or energies.

The methods of electron beam lithography are well-known in the art, as exemplified by U.S. Pat. No. 4,392,058 to Smith (incorporated specifically herein by reference). Referring to FIG. 3 of the Smith patent, the single pole lens, 64, may be replaced by a magnetic lens apparatus of the present invention or by a magnetic lens array of the present invention to permit focusing of the plurality of electron beams in the device.

3. BRIEF DESCRIPTION OF THE DRAWINGS

The drawings form part of the present specification and are included to further demonstrate certain aspects of the present invention. The invention may be better understood by reference to one or more of these drawings in combination with the detailed description of specific embodiments presented herein.

FIG. 1A illustrates a diagrammatic sectional view of a scanning electron microscope employing a lens apparatus of the present invention with a dual anode electron gun. Shown are the first anode 1, a second anode 2, the plane of the condenser lens (indicated by arrows), a stigmator 3, a first scanning coil 4, a second scanning coil 5, and annular detector 6, the specimen 7, and a lens apparatus of the present invention, consisting of a pole piece, 8, and an energizing coil, 22. In an alternate embodiment, the pole piece, 8, of the lens apparatus of Example 1, shown here, may be removed entirely, and a superconductor substituted for the energizing coil, 22, as the only focusing means beneath the specimen (see FIG. 7B), or alternatively, the pole piece, 8, may be replaced by a magnetizable sphere (see FIG. 9B) or a magnetizable needle (see FIG. 12B) contained within the energizing coil, 22.

FIG. 1B illustrates a diagrammatic sectional view of a scanning electron microscope employing a lens apparatus of the present invention with a triple anode electron gun. Shown are the first anode 1, a second anode 2, a third anode 9, the plane of the condenser lens (indicated by arrows), a stigmator 3, a first scanning coil 4, a second scanning coil 5, and annular detector 6, the specimen 7, and a lens apparatus of the present invention, 8. When a lens apparatus is employed comprising an energized coil, 22, is utilized, the pole piece shown, 8, may be removed entirely, such that the superconducting coil itself is the only focusing means beneath the specimen (see FIG. 7B), or alternatively, the pole piece, 8, may be replaced by a magnetizable sphere (see FIG. 9B) or a magnetizable needle (see FIG. 12B) contained within the energized coil. The same modifications may be made in FIG. 1A in which a 2-stage electron gun is illustrated.

FIG. 2 illustrates in section along its axis one example of a magnetic lens incorporating a number of the preferred features of the invention shown in full-scale (approximately 1.25 inches by 0.6 inches). Identified are the pole piece 10, the yoke 11, and the energizing coil 12. The optional specimen holder, 23, fixedly attached to the upper end of the pole piece is shown.

FIG. 3 illustrates in diagrammatic sectional view along its axis an example of a SEM apparatus employing a lens of the present invention to focus the beam of charged particles produced from the tip 14, of the field emission electron gun 13. Identified are the aperture 15, a first anode 1, a second anode 2, a third anode 9, the stigmator 3, the annular detector 6, a valve 16, the light pipe 17, a first deflector 18, the vacuum housing 19, a second detector 20, and the specimen 7. The lens apparatus shown here, 21, is the lens of Example 1, comprising a magnetic pole piece, 8, and an energizing coil, 22. The full-scale dimension shown is approximately 4 inches. In alternative embodiments, the lens apparatus, 21, is replaced either by a single or plurality of superconducting coils, or is replaced by the lens apparatus of Examples 4, 5, or 6. In such embodiments, the lens apparatus of FIG. 8B, FIG. 9B, FIG. 10B, FIG. 11B, FIG. 12B, FIG. 13B, or FIG. 14B may replace the lens apparatus, 21, shown here.

FIG. 4 illustrates the relationship between resolution and accelerating voltage as a function of lens focal length.

FIG. 5 illustrates the relationship between resolution and accelerating voltage as a function of the diameter of the pole piece of the present lens apparatus. The maximum theoretical value is given as the solid line. The dashed dotted line represents the highest resolutions obtained using the most superior lens system of the prior art.

FIG. 6 illustrates a top view of a multiple lens array using permanently magnetized spheres arranged in a pattern as described in Example 3.

FIG. 7A and FIG. 7B illustrate a top and side-view, respectively, of a superconducting coil, 24, lens apparatus as described in Example 4. The lens apparatus is shown on a substrate, 25, or lattice which has been coated with a protective coating, 28, to protect the coil from thermal damage. The substrate is cooled by a suitable probe, 26, fitted to a cooling device, 27, either to the temperature of liquid helium or liquid nitrogen.

FIG. 8A and FIG. 8B illustrate a top and side view, respectively, of a multiple superconducting coil lens apparatus array comprising the superconducting coil, 24, as described in Example 4 and shown in FIG. 7A and FIG. 7B. The lens array is shown on a substrate or lattice 25, which has been coated with a protective coating, 28, to protect the coil from thermal damage. The substrate is cooled by a suitable probe, 26, fitted to a cooling device, 27, either to the temperature of liquid helium or liquid nitrogen.

Figure 9A:
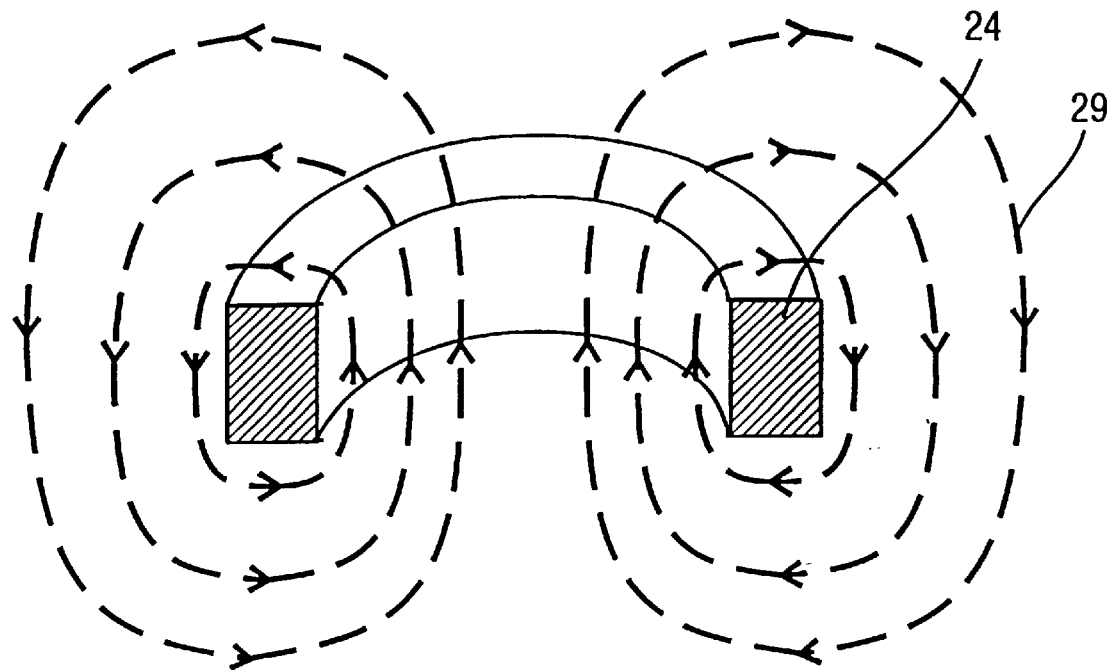
FIG. 9A and FIG. 9B illustrate side-views of a conventional energizing coil, 24, in the absence, and presence, respectively, of an internal magnetized sphere, 30, as described in Example 5. The lines of magnetic force, 29, are shown around both coils, and the concentrated lines of force in FIG. 9B are evident as a result of the presence of the sphere within the coil.
Figure 9B:
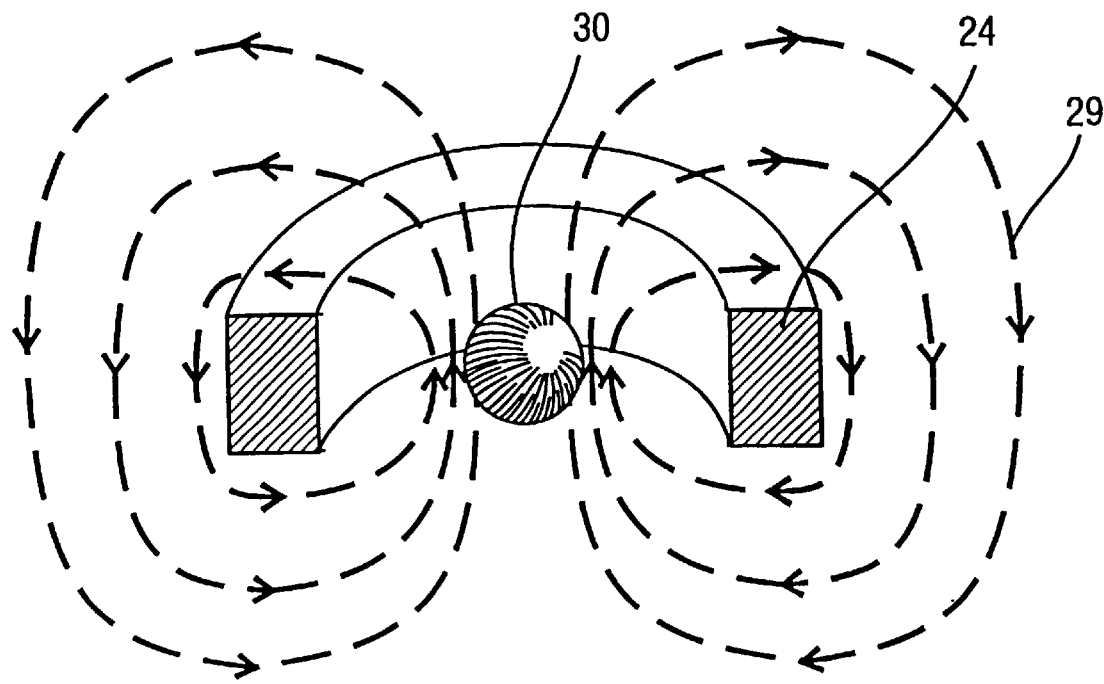
Figure 10A:
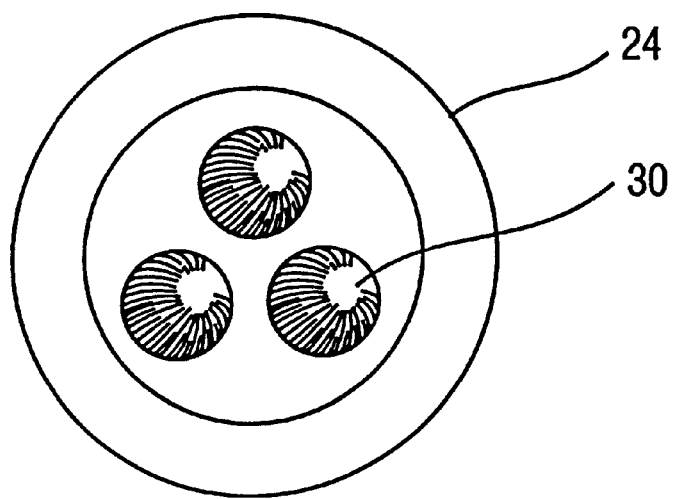
FIG. 10A and FIG. 10B illustrate top and side views, respectively, of the lens apparatus of FIG. 9B in which multiple magnetic spheres, 30, are located within a single conventional energizing coil, 24, as described in Example 5.
Figure 10B:
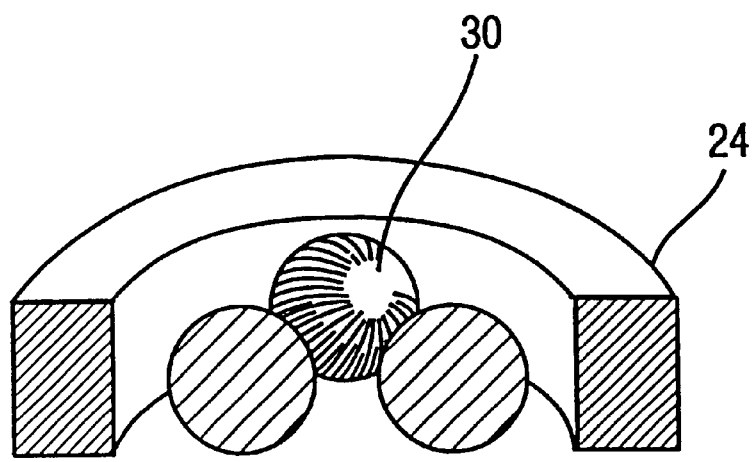
Figure 11A:
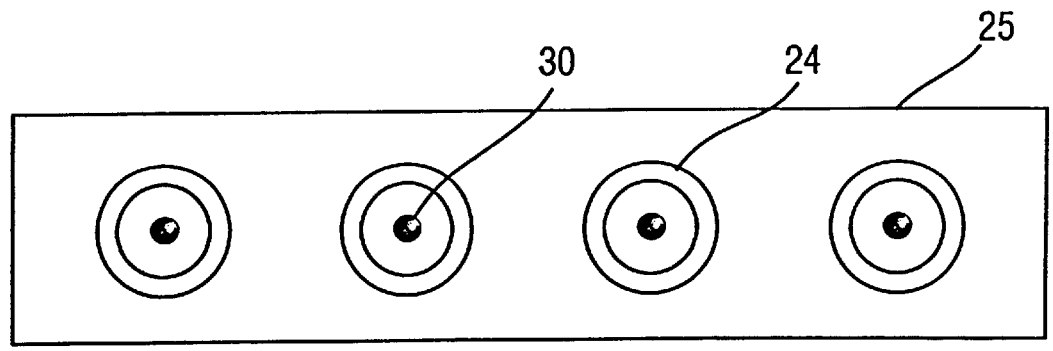
Figure 11B:
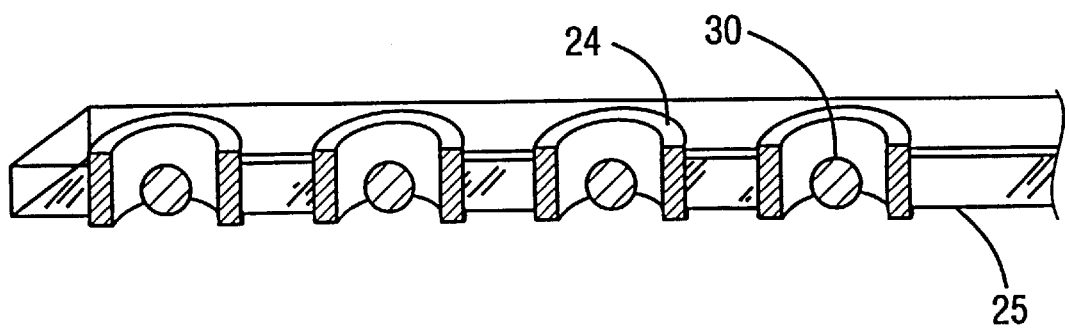

FIG. 11A and FIG. 11B illustrate top and side views, respectively, of a multiple lens array comprising the magnetized spheres, 30, within a conventional energizing coil, 24, contained on a substrate or lattice, 25, as described in Example 5 and illustrated in FIG. 9B and FIG. 10. In this array, one or more spheres may be present within each conducting coil to focus more than one electron beam simultaneously. The spheres may be of different sizes to produce fields of different strengths.

Figure 12A:
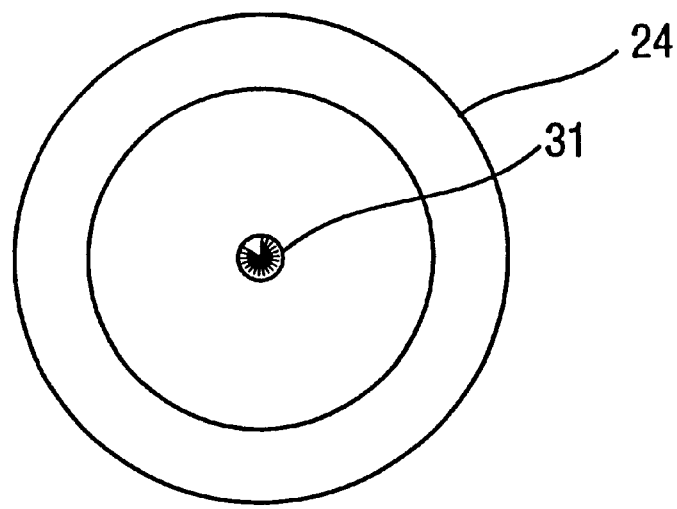
Figure 12B:
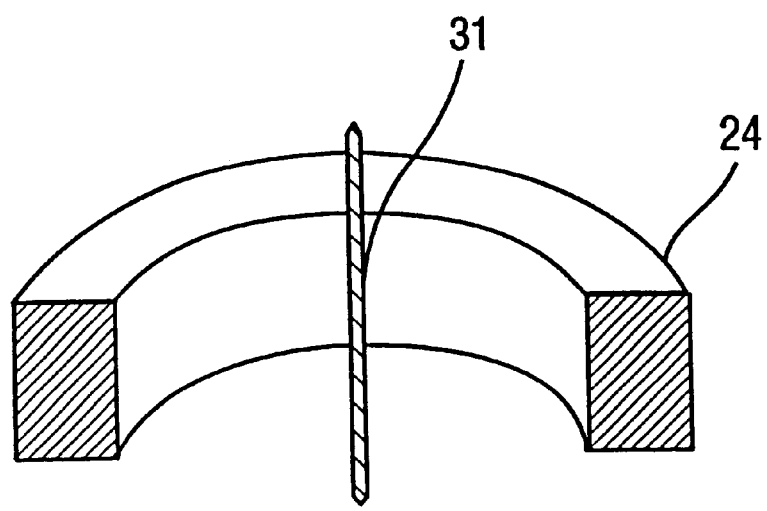

FIG. 12A and FIG. 12B illustrate top and side views, respectively, of the lens apparatus comprising a virtual magnetic monopole. The lens consists of a superconducting energizing coil, 24, surrounding a magnetizable needle, 31, as described in Example 6. The strength of the coil and the diameter and length of the needle may be varied to obtain lenses with differing field strengths.

Figure 13A:
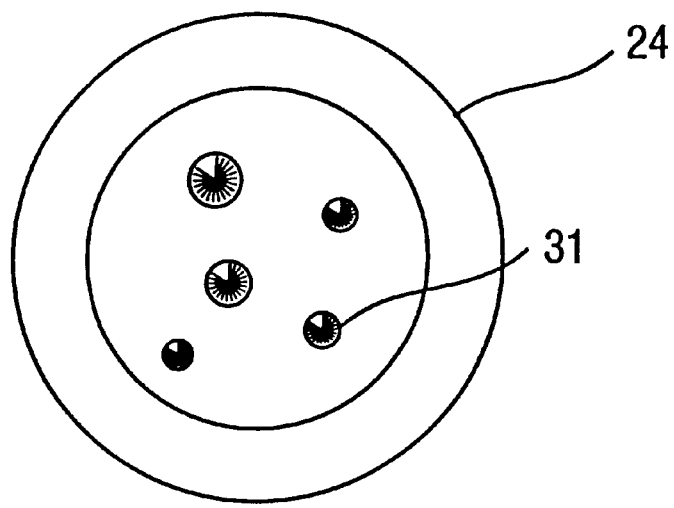
Figure 13B:
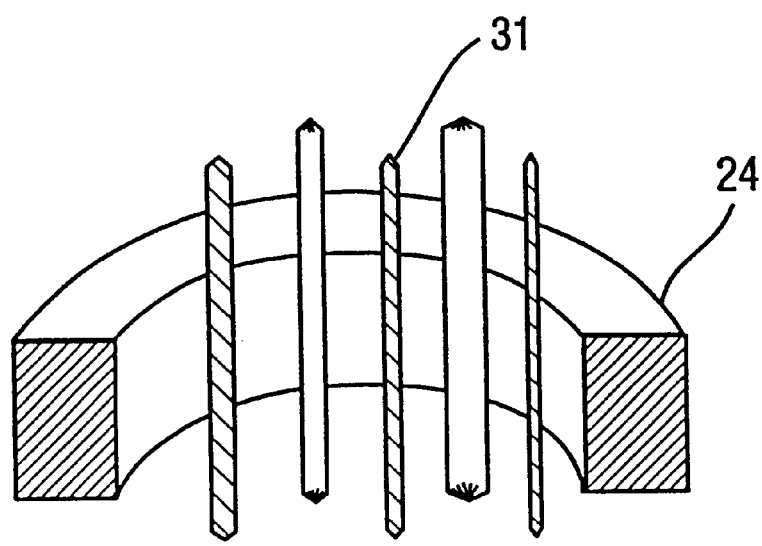

FIG. 13A and FIG. 13B illustrate top and side views, respectively, of a modification of the lens apparatus of FIG. 12 comprising an array of virtual magnetic monopoles. The lens consists of a superconducting energizing coil, 24, surrounding a plurality of magnetizable needles, 31, as described in Example 6. The strength of the coil and the diameter and length of the needles may be varied to obtain lenses with differing field strengths.

Figure 14A:
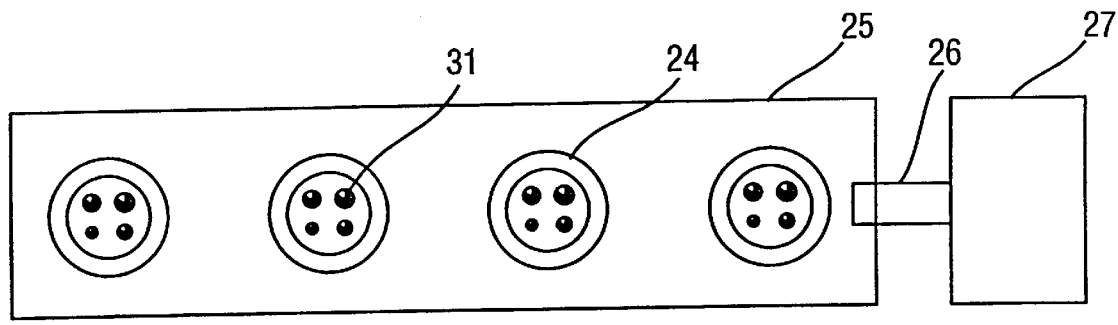
Figure 14B:
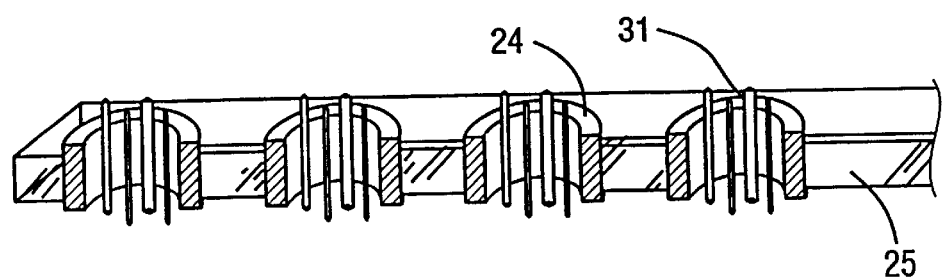

FIG. 14A and FIG. 14B illustrate top and side views, respectively, of a lens array comprising a plurality of the lens apparatus of FIG. 13. The lens array consists of multiple superconducting energizing coils, 24, surrounding a plurality of magnetizable needles, 31, contained within a suitable lattice or support, 25. As described in Example 6, the lattice may be cooled in the case of superconducting coils by a suitable cooling probe, 26, attaching the lattice to a suitable cooling means, 27. The strength of the coils and the diameter and length of the needles may be varied to obtain lenses with differing field strengths.

4. DESCRIPTION OF ILLUSTRATIVE EMBODIMENTS 4.1 Advantages of Low-Voltage SEM

It is of considerable advantage in the analysis of biological and other delicate samples to use electrons which only penetrate to a depth of about 2 nm into the specimen because in that case the penetration would roughly match the depth from which secondary electrons can be generated. This would require electrons in the range of about a few hundred volts to about 2000 volts depending upon the atomic number of the material of the specimen (e.g., 3).

The unfortunate consequence of this is that the resolution of the SEM declines to a level that is no longer of interest to many investigators. It is not difficult to see the reason for this decline in resolution. The electrons which are generated by the source always have some spread in their energies and because of this spread of energies there is a corresponding axial spread of the focus of the electrons at the specimen. At high voltages this is not of serious consequences because the resolution is primarily determined by spherical, not chromatic, aberration.

However, as the voltage is reduced chromatic aberration becomes more and more important and finally becomes the dominant one. To be very specific at low voltages it is the chromatic aberration of the lens which can be thought of as the cause of the focus defect and the chromatic aberration of the magnetic lens is very closely equal to its focal length (Crewe, 1995). As a consequence of this the radius of the focused probe at the specimen is given by $$\delta = f\alpha \frac{\Delta V}{V}$$

where DV is the energy spread, V is the accelerating voltage, f is the focal length, and a is the semi-angle of convergence of the electrons at the probe.

Additionally the effect of the diffraction of electrons at the aperture which forms the probe must be taken into account.

The optimization of lens operation is governed by the equation representing the ultimate resolution:

$$\delta = \frac{(f\Delta V)^{1/2}}{V^{3/4}} \times 2.74 \times 10^{-5} (m)$$

Thus, it is clearly advantageous to use electrons with the smallest possible energy spread and that implies the use of a field emission source of which there are two kinds, the cold field emission source (CFE) with an energy spread of ±0.1 eV and the thermal field emission source (TFE) where the value is ±0.24 eV.

It is clear from this equation that if one takes an SEM which has been designed to operate at 30 kV with a maximum magnetic field of around 2 T and a resolution of about 0.7 nm (which is about the state of the prior art), and then lowers the operating voltage to about 1 kV the resolution would be only about 4 nm. In fact, this is precisely the value which is claimed by the best instrument on the market today (Zeiss).

4.2 A Need Exists For Improving Resolution in Low-Voltage SEM

In the area of semiconductors, an important consideration is the constant reduction in size of circuit designs. As the size reduction of patterns progresses, there arises a need to check if each process of production has been carried out exactly. Routinely, the inspection of resist and etching patterns is carried out by SEM analysis. In fact, specialized SEMs have been designed specifically for that purpose (Takashima, 1994).

The lens apparatus of the present invention greatly facilitates construction of an SEM for the morphological observation of semiconductor wafers. The advantages offered by the present invention include 1) high resolution at low accelerating voltages, 2) capability of large angle tilting of the specimen stage, 3) increased limits of specimen size due to the compactness and stationary nature of the lens apparatus; 4) capability of multiple lens arrays for both imaging and positional calibration of semiconductor wafers, again owing to the small size of the lens apparatus; and 5) the ability to incorporate an SEM directly into a production line.

4.3 Technical Limitations of a Low-Voltage SEM

Quite recently the present inventor has examined the ultimate size of the electron probe in such probe-forming instruments as the SEM (Crewe, 1995). In doing so, restriction was made to the use of conventional materials where the maximum magnetic field is around 2.5 T, and general assumptions were made about the form of the magnetic field generated in the lens.

The results obtained were insensitive to the assumptions of the shape of the field or the maximum magnetic field, and the calculations were made without regard to practical issues with a maximum assumed field strength of 2.5 T adjusted in a Gaussian-shaped width to produce a focus at the point of maximum field.

It became apparent that the spherical aberration component dominates the resolution, except when the accelerating voltage is 200 V or less. The results indicated that using the lens designs disclosed herein, it should now be possible for the first time to achieve a resolution better than 1 nm at 1000 V, which would represent a monumental improvement over any conventional lens apparatus in the prior art.

Figure 4:
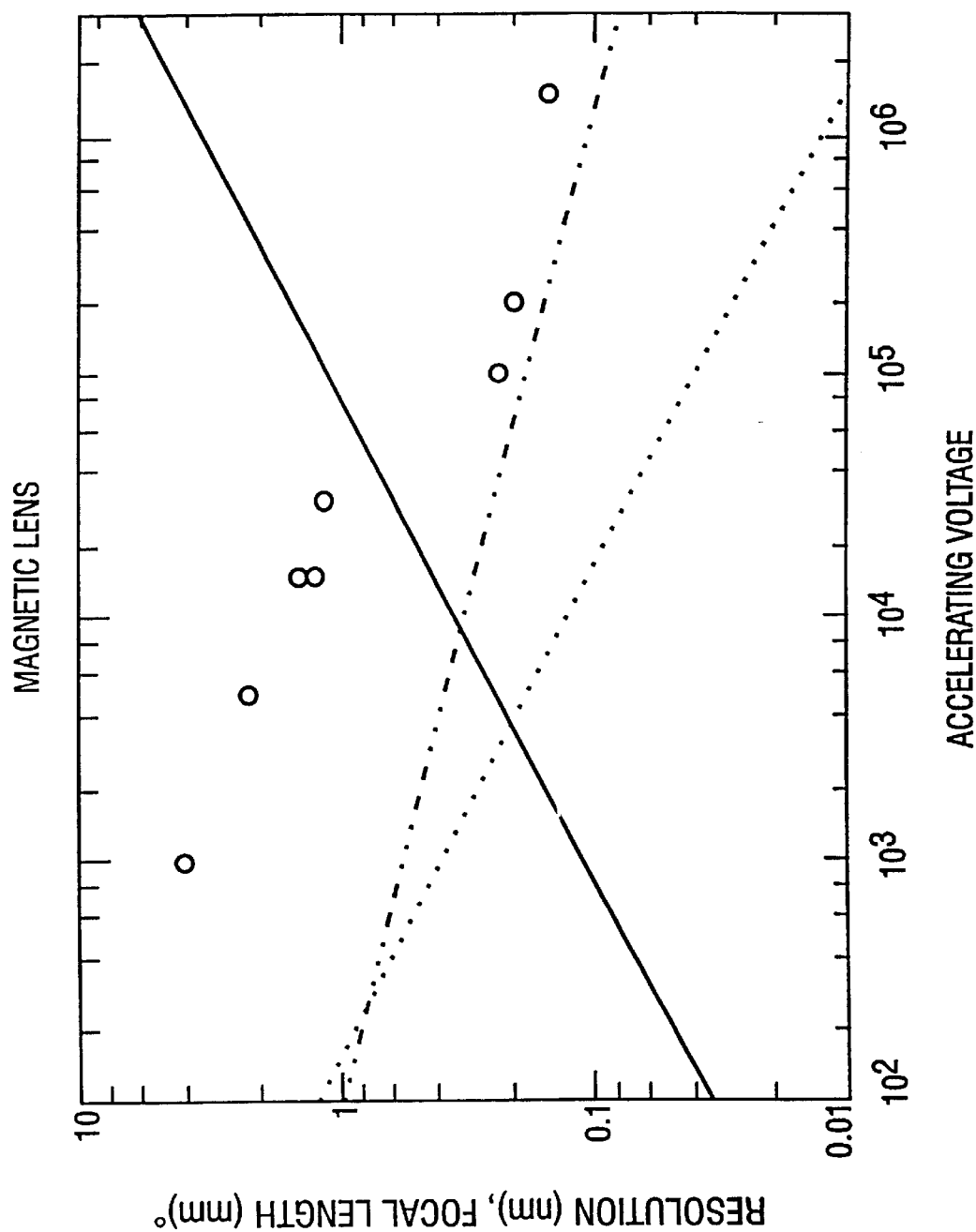
Figure 5:
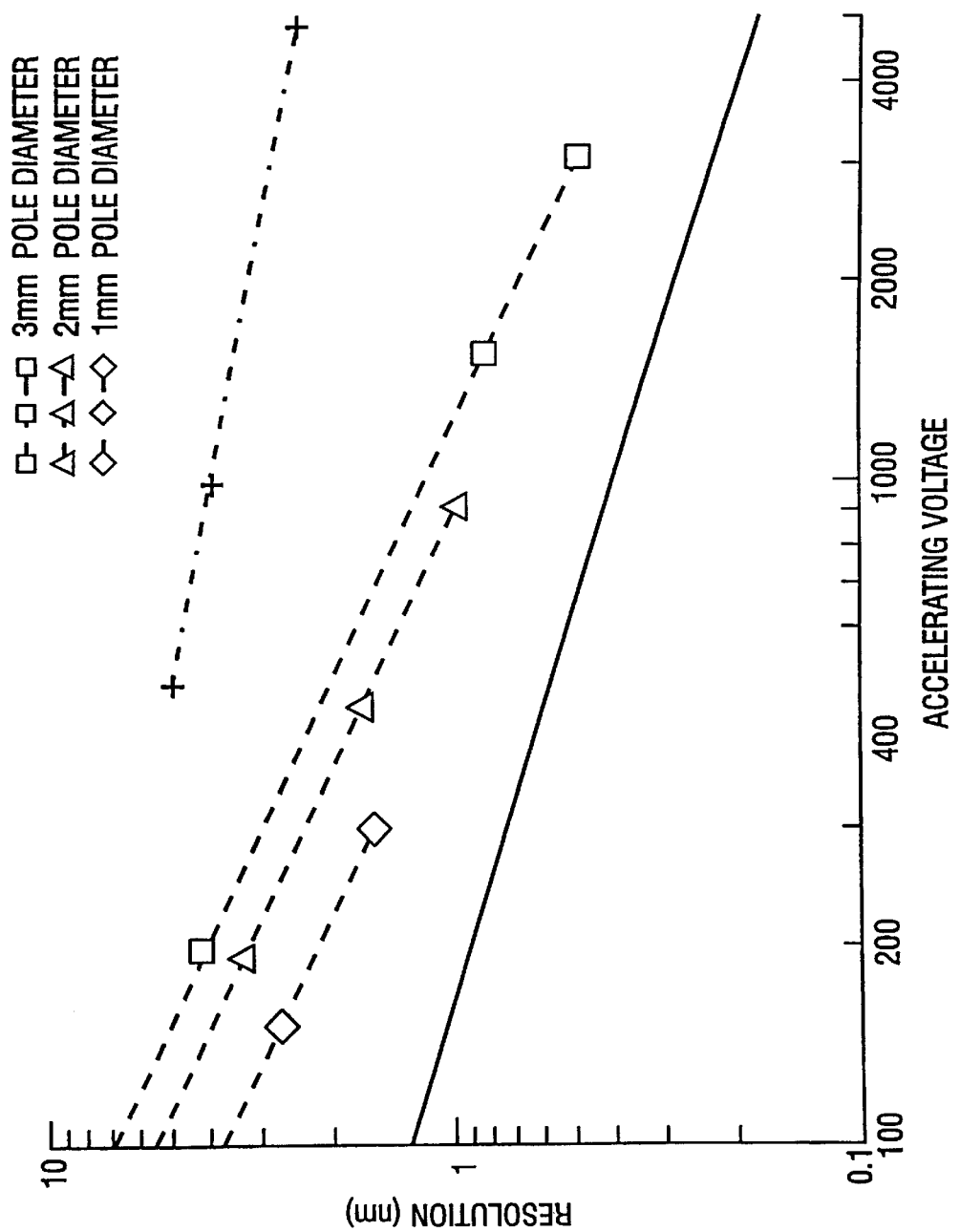

It became clear from these calculations that in order to achieve such a resolution it was necessary that the lens have a very short focal length. In FIG. 4 the limits of resolution due to spherical aberration (dashed-dotted line) and chromatic aberration (dotted line) are shown for magnetic lenses operating at maximum magnetic field. The corresponding focal length is shown as a solid line. This line represents the resolution which is theoretically possible at various accelerating voltages together with the focal length which the lens would have in order to achieve that resolution. Superimposed on the curve are the resolution of several commercial instruments using data taken from manufacturer's specifications. From left to right, the commercial instruments illustrated include those manufactured by Hitachi, Zeiss, two models available from J.E.O.L., a microscope designed by the present inventor, one from Fisons, another from J.E.O.L., and finally, one produced by Berkeley Instruments.

At high voltages, the lens designs of the prior art perform very close to the theoretical limit; however, at low voltages these lenses perform three to four times worse than the theoretical limit due to the small focal lengths required at low voltages. These conventional lens designs do not permit such small focal lengths and are therefore unsuitable for low voltage high-resolution analyses.

In sharp contrast to the prior art, at low voltage ranges the present invention provides lens apparatus which are clearly superior to the resolution of any instrument presently available owing to the very short focal length of the disclosed lenses. Moreover, the size and composition of particular lens designs, including those comprising superconducting coils, permit for the first time fabrication of multiple lens arrays consisting of closely-spaced lenses useful in simultaneous or consecutive focusing of one or more beams of charged particles. In the area of electron microscopy, such multiple lens arrays permit the fabrication of a single microscope having multiple-specimen imaging capabilities, or alternatively simultaneous imaging of multiple parts of a single specimen. Such lens designs represent a clear advantage over the prior art in providing high-resolution focusing of multiple images of such delicate specimens as biological samples, semiconductors, and related electronic components. In the field of lithography, such lens arrays permit for the first time simultaneous etching probes to be fabricated having probe sizes of varying diameters, or multiple probes having beam energies controlled by one or more energized coils.

4.4 Lens Apparatus Designed to Highly Resolve Low-Voltage Charged Particles

In order to achieve a condition where the magnetic field increases very rapidly near the focus at the specimen we need a field of the form $$B = \left(B_0 \left(\frac{a}{z}\right)\right)^n$$

where $B_0$ is the maximum field readily attainable (2.5 T) and a is the distance from the origin at which that field exists.

A coil is required to energize the lens and the number of ampere turns which are required may be calculated by integrating along the axis:

$$NI = \frac{10}{4\pi} \times \frac{B_0 a}{(n-1)} = 7,960 \frac{a}{(n-1)} A.T.$$

where a is in cm. When a=1 mm, $$NI = \frac{796}{(n-1)} A.T.$$

To consider the power requirements for the coil, examine a coil with an inner radius $r_1$, an outer radius $r_2$ and a height h. To define a shape parameter:

$$\eta = \frac{r_2 + r_1}{r_2 - r_1}$$

the power in the lens is closely approximated by $$W = \frac{\eta}{h}(NI)^2 \times 10^{-5} \text{ watts}$$

and for the case of a=1 mm, $$W = \frac{6.3\eta}{h(n-1)^2} \text{watts}$$

Thus, from the definition of h that it is relatively easy to have h~1. For example if $r_2$+5 mm, h=1.33.

The final and most difficult task is to select a geometry for the iron which will define a particular value of n. By approximation, and based upon a number of attempts, values of n between about 2 and about 3 are contemplated.

For the case n=2, this corresponds to a single isolated magnetic pole which, of course, does not exist. However, a uniformly magnetized long needle is a close approximation, so a long iron rod may be energized by a solenoid wrapped around it. In that case h is taken to be large, perhaps 10 cm or so, and a slender coil, say $r_1$=1 mm, may be used. Thus, $r_2$=2 mm so that h=3, and the power of the coil would be approximately 3 watts.

For n=3 (corresponding to a magnetic dipole), the field may be exemplified by a uniformly magnetized sphere. Ideally this would consist of an iron sphere with an infinitely thin coil wrapped around it but practically such may not be achieved, because the power would be too high. A more practical approximation would consist of an iron rod with a hemispherical end surrounded by an excitation coil and a magnetic yoke to return the flux. This configuration emulates a magnetic dipole.

Figure 2:
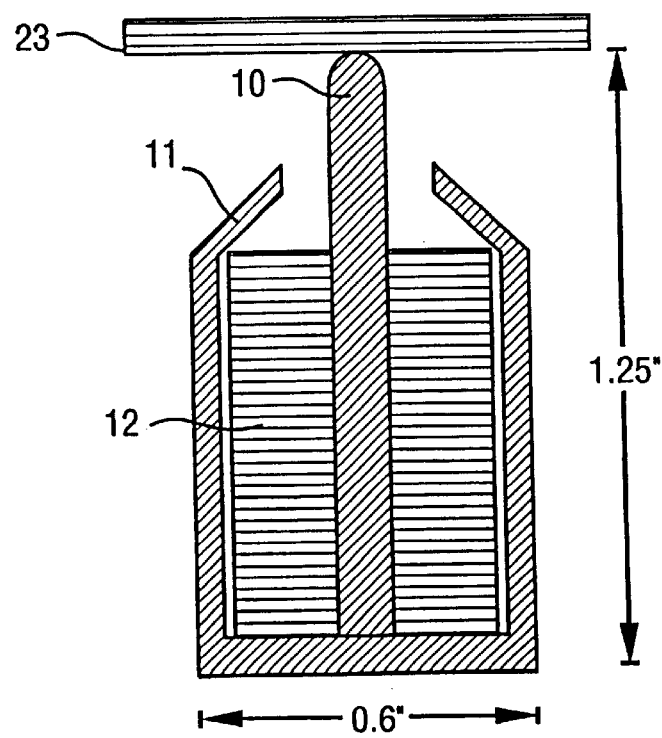

Taking all the various factors into account, a preferred embodiment of one of the lens apparatus of the present invention is illustrated schematically in FIG. 2. In this figure a pole piece 10 with a hemispherical end, surrounded by an energizing coil 12 projects through a return yoke 11 which is tapered at about a 45° angle to allow specimen tilt. The precise configuration of the pole piece and yoke may be altered depending upon the particular application of the lens apparatus, with alteration of the angle and design of the yoke possible.

The coil shown here is 2 cm long, so that for a=1 mm, $r_1$=1 mm, $r_2$=5 mm and then the power consumption would be less than 1 watt.

The lens has a layer of material of high magnetic permeability arranged around the side of the coil remote from the source of charged particles. This layer of magnetic material forms the yoke, and is preferably continuous within the periphery of the coil. The yoke is integral with or is in proximal contact with the cylindrical pole piece.

The yoke may also extend around the periphery of the coil and in some circumstances this peripheral magnetic layer may project beyond the side of the coil facing the source of charged particles. The yoke may extend to cover an outer portion, but not the whole, of the side of the coil facing the source of charged particles, and may be suitably shaped so as to modify the magnetic field distribution.

The electrically-conducting coil of the lens apparatus is preferably made as small as possible consistent with the satisfactory operation of the invention, and may conveniently be a winding of copper or other suitable wire. Alternatively, the coil may be fabricated such that the magnetic circuit is confined by a layer of magnetic material for the greater portion of its length. It is desirable that the magnetic field may be practically uninfluenced by the particular geometry chosen for the coil, and that the magnetic field strength along the axis of the lens depend primarily upon the number of turns of the coil winding and the extent of the electric current passing through the coil itself.

The electrically-conducting wire coil may be wound either with wire of any convenient cross-sectional shape or with thin metal strip. Anodized aluminum tape as described in U.S. Pat. No. 3,870,891 (specifically incorporated herein by reference) may conveniently be employed in this fashion.

In some applications, such as those comprising an electron microscope, the lens apparatus of the present invention is contained within a single or multiple vacuum chamber. In such applications, the magnetic lens is preferably constructed to have vacuum properties compatible with the conditions required within the chamber. This may conveniently be done by encapsulating the electrically conducting wire coil in a vacuum-tight enclosure, which enclosure may be formed by either a part or the whole of the combination of the aforementioned yoke and the magnetic pole piece together with a layer of non-magnetic material (for example brass or non-magnetic stainless steel) joined together with vacuum-tight seals to complete such an enclosure.

In an alternate embodiment, the lens apparatus may be located outside of the vacuum chamber behind the specimen position, thereby simplifying the construction of the magnetic lens which is no longer required to be compatible with the vacuum conditions existing within the chamber. This embodiment is the preferred positioning of the disclosed lens apparatus when employed in lithographic etching processes. ps 4.5 SEM Devices Comprising a Magnetic Lens Apparatus of the Invention The fabrication and construction of SEMs is well-known in the art. The general considerations for column fabrication, vacuum systems, imaging and recording systems and lens manufacturer have been described in various publications and are well-known to those of skill in the field. As a brief overview, however, the inventor contemplates that SEMs employing the novel lens apparatus of the present invention will generally comprise the following components:

4.5.1 Electron Gun

A field emission source is preferred as the source of electrons because these sources have the lowest energy spread of any known electron source. This in itself is a major contribution towards being able to achieve a very small focused probe size. The electrons emitted by the source are generally emitted with an energy which is incompatible with the requirements of the microscope. For a cold field emission (CFE) source the energy emission may be generally on the order of about 3 to about 4 kV, whereas in a thermal field emission (TFE) source, the energy emission may be generally on the order of about 3 to about 8 kV.

Figure 1A:
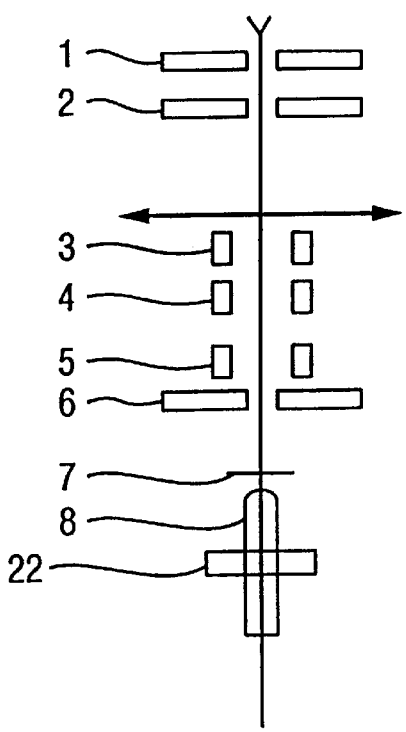
Figure 1B:
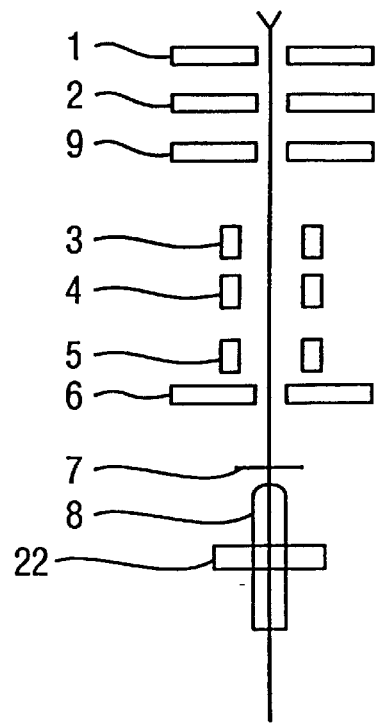

This range of operating voltage is not under the immediate control of the designer or the operator of the instrument and as a consequence an electron gun is required which will change the energy of the electrons to that required by the operator. This may be achieved using a single-stage gun which uses only the source and two additional electrodes (anodes) (FIG. 1A), or alternatively, a preferred scheme is to use a two-stage gun with three electrodes (FIG. 1B).

The voltage between the source and the first electrode controls the emission current and as mentioned above, may be anywhere from about 3 to about 8 kV. The third electrode is the one that establishes the final energy of the electrons, and in a preferred embodiment, this final energy is generally on the order of about 10 to about 2000 V. The central electrode may be used to control the position of the image of the source formed by the electron gun, and such image may be formed either before or after the final single-pole lens.

In another embodiment, the present invention contemplates an alternative electron gun configuration, which employs a single-stage gun, that is to say one with only two electrodes, which could be followed by a very simple and rather weak magnetic lens which would serve the same function as the second focus electrode. In either case the function of the electron gun with or without the additional condenser lens is to produce an electron beam of a chosen energy and a chosen diameter in the plane of the specimen.

The voltages in the gun may be quite low by normal standards and therefore smaller insulators and smaller spacings may be employed. This in turn means that a gun may be used which is physically small, which is advantageous in many circumstance. For example the electron optical system will be less susceptible to external magnetic fields and also mechanical vibrations will be minimized. In preferred embodiments, either TFE or CFE sources may be employed, with TFE sources being particularly preferred owing to less stringent vacuum requirements for the TFE source. Electron sources providing a beam of electrons with an accelerating voltage of between about 10 and 10,000 V are preferred, with sources capable of producing accelerating voltages of between about 100 and 5,000 V being more preferred. Accelerating voltages of between about 3,000 V are particularly preferred.

4.5.2 Column

The specimen itself may be placed a small distance away from the electron gun, say a few centimeters, and in this space a series of scan coils is needed which would be used to deflect the electron beam in a raster fashion in order to scan the final focused probe across the specimen. In addition to the scan coils it is convenient to also insert a stigmator of conventional design which is used to correct the "out-of-roundness" of the electron beam. The specimen would be placed below the scan coils and immediately below the specimen would be one or more of the magnetic lens apparatus disclosed herein.

4.5.3 Lens

The lens apparatus of any of Examples 1–6 are employed in the preferred embodiment of SEM, and particularly in low-voltage, high-resolution applications. These lenses, and particularly those as disclosed in Examples 2–6 are preferred in applications relating to lithographic processes.

The pole piece of the lens apparatus of Example 1 may be made of iron, holmium, or other magnetic material, and is preferably on the order of about 1 to about 4 mm in diameter. More preferably the pole piece is about 2 or 3 mm in diameter. The pole piece may be tapered or angled at its uppermost end, and a specimen stage may be optionally attached perpendicularly to the longest axis of the pole piece at this uppermost end. Where desirable, a lens array system may be utilized in which a plurality of lenses are arranged for imaging multiple specimens simultaneously or consecutively, or for simultaneous or consecutive multiple images of a single specimen.

It is clear from the dimensions of the lens illustrated in FIG. 2 that a complete low-voltage microscope column could be very small in diameter, perhaps as small as about 1 cm. This makes it possible to arrange a number of columns in a close-packet array. Such an array may be useful to inspect semiconductor devices or other specimens such that many images could be obtained simultaneously or consecutively. Examples of lens arrays comprising a plurality of the disclosed lens apparatus are illustrated in the drawings.

Heat may be dissipated from the lens apparatus of Example 1 either by evaporative cooling or by forced cooling of the lens by a circulating cooling solution such as water and the like. Alternatively, a solid finger-like extension or probe may be in proximity with any of the lens apparatus disclosed herein which may cooled by an outside source such as a conventional liquid nitrogen or liquid helium assembly. Such a configuration is particularly preferred when a pole piece of holmium is utilized in the lens apparatus of Example 1 rather than a conventional iron pole piece, and also when superconducting coils as described in Example 4 are employed as lens apparatus.

Alternatively, when it is desirable to produce a greater magnetic strength lens, the pole piece of the lens apparatus disclosed in Example 1 may be fabricated out of other suitable magnetic materials, e.g., i.e., holmium metal cooled to liquid nitrogen temperature. Such a pole piece may be expected to generate on the order of 4 T field strength vs. the conventional 2 to 3 T achieved using an iron pole piece.

The inventor contemplates that the magnetized sphere lens apparatus disclosed in Example 3 should permit a field strength of about 0.5 to 1 T, while the lens apparatus disclosed in Examples 5 and 6 should permit a field strength of about 0.8 to about 1.5 T. The field strength of the superconducting coil lens apparatus of Example 4, however, can be modulated to permit significantly higher field strengths, on the order of about 10 T.

Each of the lens apparatus disclosed herein will preferably have a lower level of spherical aberration than those of conventional lenses, and provide an essentially-radial magnetic field to focus either a single, or multiple charged particle beams.

4.5.4 Electron Detector

There are innumerable ways in which the electrons emerging from the specimen may be detected. These electrons, whatever their energy, will travel backwards along the magnetic field lines, that is to say towards the scan coils, but since many are generated at large angles of emission and since they have a different energy from the incident electrons it is possible to separate them. One method is to use an annular detector such that the incident electrons pass through the aperture. Alternatively, other electron detection mechanisms such as those commonly used in SEM practice may be utilized. When simultaneous imaging of multiple images is contemplated, a device comprising one or more electron detectors may be employed to permit detection of electrons from various portions of the specimen.

4.5.5 Specimen Handling

In preferred embodiments, the specimen holder or stage may be fixedly attached to the conical topmost end of the magnetic pole piece of the lens apparatus disclosed in Example 1, or alternatively, for the other lens apparatus disclosed, the specimen holder or stage may be permanently or fixedly attached to a position above the lens apparatus of Examples 2–6. In some situations, it may be desirable to cool the stage and/or specimen holder, and such may be accomplished either by ambient dissipation of heat, or by cooling the specimen/stage with a cooling fluid in a manner described herein for the cooling of the lens apparatus itself.

As an example, considering the lens apparatus of Example 1, referring to FIG. 2, a cylindrical magnetic pole piece 10, manufactured from e.g. soft iron or other magnetic material of high permeability, occupies the whole of the volume surrounded by the coil 12. The magnetic pole piece extends beyond the end of the yoke 11 and is symmetrical about the axis surrounded by the coil. In intimate contact with the end of the pole piece away from the specimen, the yoke is made of a layer of material of high magnetic permeability such as cold rolled steel which extends around the periphery of the coil. The lens is positioned to be coaxial with the beam of charged particles and can be suitably excited by energizing the coil to focus such a beam.

The design and fabrication of specimen stages is well known in the art, and any suitable stage may be utilized in conjunction with the present invention. One such stage is an X-Y stage obtained from Burleigh Instruments, Inc. (Fishers, N.Y.). This stage is an electrostriction device which only requires electrical connections to pass into the vacuum system. The stage may be mounted on a rotating arm so that the degree of specimen tilt can be adjusted. The specimen holder may then be fixed to the stage by means well-known to those of skill in the art.

In one embodiment when it is desirable to have a tiltable stage, the specimen may not be at the point of maximum field strength, and hence field strength may be reduced slightly. Space may be allowed for a specimen tilt of up to and about 45°. For a pole of radius r, the specimen is at the point r√2 and consequently the field strength is reduced by a factor of 2√2 from that at the pole.

Where desirable, the specimen stage may be sufficiently large enough to permit the simultaneous imaging of multiple portions of a single specimen or a plurality of specimens placed upon a single specimen stage above an array of lens apparatus as discussed herein. The inventor contemplates a particular utility of this configuration in the imaging of semiconductor wafers, fragile biological specimens, and electronic components and the like where multiple imaging is desirable. The modification of a conventional SEM column to permit multiple charged particle beams to impinge upon such a specimen is contemplated to be within the scope of the present invention. Such modification is a relatively straightforward matter, and in general terms may comprise a plurality of individual columns each comprising an electron source, all of which terminate at a point above the specimen under which the plurality of lens apparatus have been placed for imaging the individual particle beams which impinge upon the surfaces of the specimen so contained.

4.5.6 Vacuum System

The electron gun needs its own vacuum pump and a single ion pump of a few liters per second may be employed. Experience will indicate the precise pumping speed which is necessary but a pump as small as 8 l per second may be sufficient. A vacuum level of about $10^{-9}$ Torr would be preferred. Such vacuum systems are commercially available from Varian Vacuum Products, Fisons Vacuum Generators, ULVAC Technologies, and Physical Electronics, among others.

The specimen chamber may be quite small and uncluttered so that it is convenient to open up the whole chamber when changing specimens. A complete pumping station commercially available (e.g., Balzers, Inc.) is an example of one such preferred evacuation system. This station includes the roughing pump, a turb pump and complete instrumentation. The ultimate vacuum level may be on the order of about $10^{-7}$ Torr, although other suitable vacuum ranges may also be contemplated to be useful.

An important practical advantage of the invention is that the lens apparatus disclosed herein may be conveniently fitted into an electron beam apparatus so as to leave the whole space between the source of charged particles and the target position around the beam of charged particles available for placing large specimens, and/or a secondary electron detector or "light pipe."

4.5.7 Additional Features

If the specimen is very thin or if it has holes in it then it may be possible for some of the incident electrons to strike the pole piece and generate electrons. This may produce some background noise. However, because the incident electrons have such low energies penetration should be a rare occurrence but a thin coating of carbon or other suitable material on the iron pole piece will reduce the background by a large factor. Methods for coating carbon onto the pole piece are well known to those of skill in the art (e.g., by using a vacuum evaporator). It should be noted that the bare pole piece itself may serve as a specimen in its own right, which will be very useful for the purposes of column alignment and the like.

Regarding the field of view, particularly at low magnifications, concern arises because of the sharp radius of curvature of the pole piece. Electron optics suggest that other third order aberrations may become important, such as coma, astigmatism, distortion and curvature of field. Mechanisms for controlling such aberrations have been previously published (Crewe and Parker, 1976). At most this would involve some additional electronics. Dynamic stigmation presents no problem and distortion may be controlled in exactly the same way as it is done in TV sets, by adding nonlinear terms to the scan voltage. Curvature of field can be controlled by dynamically changing the virtual focus of the incident electron beam. For a fast scan this may be best accomplished by adjusting the middle electrode of a three-element electron gun. For slow scans it is also convenient to adjust the current in a condenser lens.

4.5.8 Cooling the Coil and Lens Apparatus

The size of the magnetic lens may be significantly reduced by comparison with conventional lenses by providing the coil with cooling means located, for example, within the layer of magnetic material or within the structure of the coil, thereby allowing a required magnetic field to be generated by a larger electric current flowing in a smaller number of turns of wire.

When desirable, the specimen stage and/or specimen holder may be cooled by ambient dissipation of heat energy, or alternatively by flowing a cooling solution around the specimen housing in a manner analogous to that of cooling the lens apparatus itself. Such a cooling fluid may be water, glycol, polyethylene glycol, liquid nitrogen, or other such suitable fluid. The use of a cooled specimen stage may be particularly desirable in the case of biological specimens.

The following examples are included to demonstrate preferred embodiments of the invention. It should be appreciated by those of skill in the art that the techniques disclosed in the examples which follow represent techniques discovered by the inventors to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

5. EXAMPLES

5.1 Example 1

Lens Apparatus Comprising a Solid Pole Piece

The present example concerns the general description of a low-voltage SEM particularly useful in the analysis of biological and other fragile specimens which comprises a magnetic lens apparatus having a solid pole piece.

5.1.1 Schematic View of Solid-Pole Piece Lens Apparatus

Schematic cross-sectional diagrammatic views of the components of either a two anode (FIG. 1A) or three anode (FIG. 1B) illustrate the preferred elements of a SEM employing one of the disclosed lens apparatus. A full-scale view of an SEM employing the lens apparatus of the present invention is shown in FIG. 3.

Figure 3:
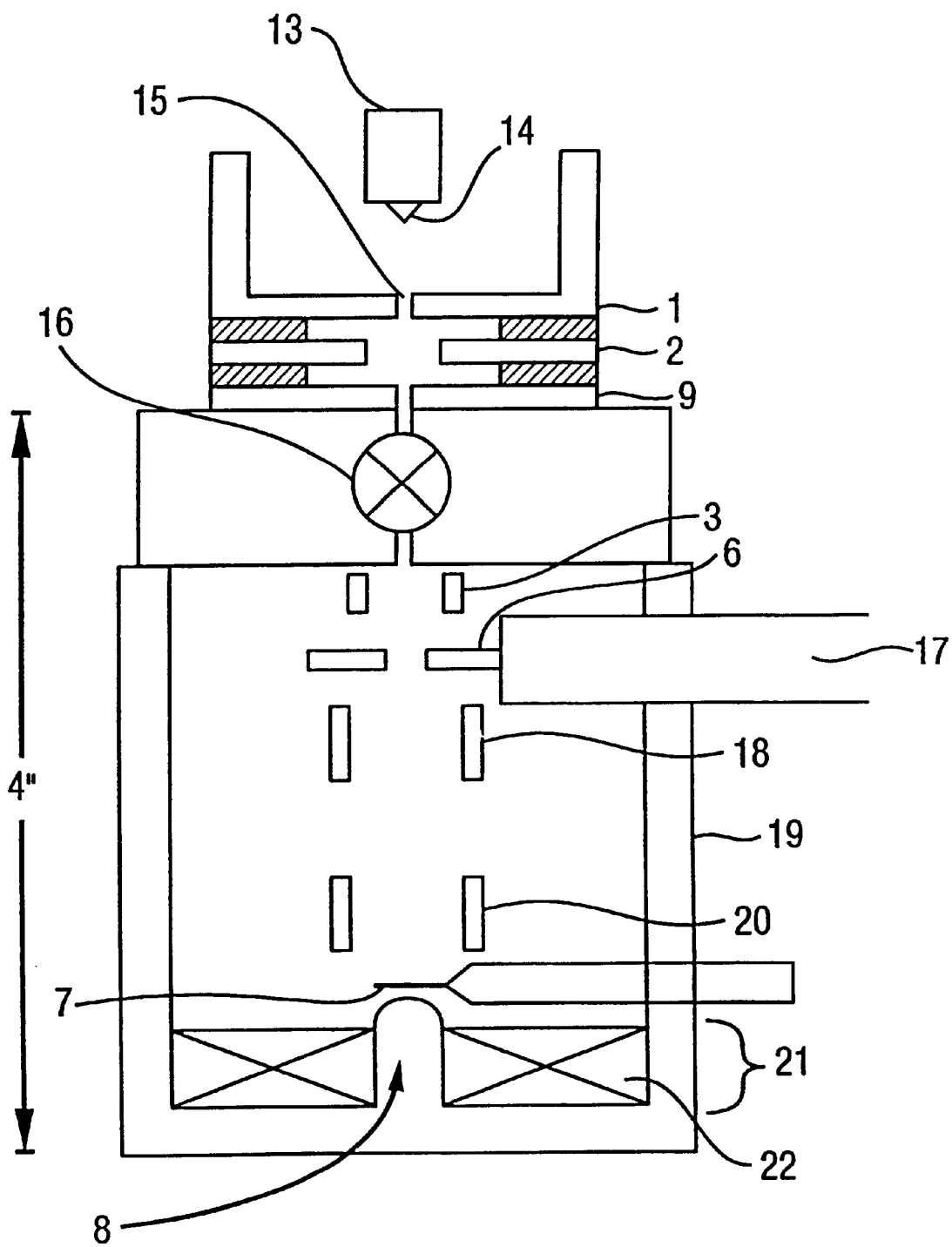

Referring to FIG. 3, a beam of electrons are produced from the tip 14 of a field emission source 13. Said beam passes through an aperture 15 and is accelerated by a first anode 1, a second anode 2, and optionally a third anode 9. A valve 16 isolates the vacuum of the gun from that of the rest of the column. Concentric with the axis of the beam produced, and in a plane normal thereto, is situated a stigmator 3, and first 18 and second 20 scanning deflector coils all of annular shape.

The single pole lens 8 projects from the coil 21, a short distance towards the source and causes the beam of electrons produced from the electron gun to be brought to focus at the target position 7 where the specimen is located. An X-ray detecting device 17 receives radiation reflected from the specimen onto the annular detector 6 which collects the secondary electrons produced by interaction of the beam with the specimen. The housing 19 contains the components of the system and preserves the integrity of the vacuum system; it may be made of iron or other suitable material.

5.1.2 Electron Optical Calculations

In order to estimate the performance of the system the existence of a magnetic field was assumed where the field strength depends upon $Z^n$ where Z is the distance along the axis from the dipole. Ray tracing calculations were then performed in such fields.

The field strength was normalized at a distance of z=1 cm and trajectories were then calculated from a source at z=10 cm, giving the position of the focus, the value of the field at that focus, the aberration coefficients and the magnification.

Considering the case where a=1 mm, in order to use this condition a focus at 1.4 mm or so is chosen to allow space for a specimen tilt. Further, at a value of z=1 mm the maximum magnetic field is 2.5 T. For n=3 this means a field value of 0.88 T at the focus and for n=2 the corresponding value is 1.25 T. Thus the maximum value of the electron energy and the various aberration coefficients may be specified for any particular value chosen:

For $n=3 V_{max}$=1200 v, $C_s$=−0.018 cm, $C_c$=0.038 cm, m=0.007.

For $n=2 V_{max}$=7600 v, $C_s$=0.033, $C_c$=0.074, m=0.015

To calculate the resolution, it is important to consider the contribution of spherical aberration even when a TFE source is utilized. The dominant factors contributing to the resolution are spherical aberration and diffraction. Using the usual expression $$\delta = 0.43 C_s^{\frac{1}{4}} \lambda^{\frac{3}{4}}$$

and assuming an accelerating voltage of 1 kV in each case, a resolution of 0.8 nm for n=3 and 0.9 nm for n=2 is calculated.

Thus the present invention provides a resolution of 1 nm at 1,000 V, and importantly, the detailed shape of the lens element itself is not critical.

5.2 Example 2
Electron Focusing Using Dipole Lenses

In addition to the lens apparatus of Example 1, having noted that a magnetic dipole made an excellent focusing lens for a low energy electrobeam when placed below the specimen rather than above it, the inventor began to consider additional ways in which such a dipole lens could be fabricated.

This example describes the inventor's demonstration of the electron optics related to the construction of the lens apparatus herein which employ magnetic dipoles, and virtual magnetic monopoles.

5.2.1 Magnetic Field Strength

When one considers a magnetic dipole which produces a magnetic field distribution which is symmetrical about the axis (which the inventor calls the z-axis) the magnitude of the magnetic field strength is given by $$Bz = \frac{2\mu}{z^3}$$

where $\mu$ is the dipole moment, with dimension Tesla m$^3$.

If one considers a beam of electrons which is parallel to the axis at infinity and which is incident on the dipole, the focal properties of a dipole lens can then be determined by using the usual equations of motion for cylindrically symmetric fields. The equation for the first order focusing can be written as Crewe, 1991

$$r'' + r\frac{U^2}{4} = 0 \quad (1)$$

where r is the radius of an incident electron measured from the z-axis and U is a field parameter which is normalized to the electron energy.

$$U = \frac{B}{R} = \frac{2\mu}{Rz^3}$$

and R is the rigidity, with dimension T.m. and it has a value for electrons of $$R = 3.37\sqrt{V} \times 10^{-6}$$

where V is the accelerating voltage. The differential equation then becomes $$r'' + \frac{\mu^2}{R^2 z^6} r = 0$$

The quantity $\mu/R$ occurs frequently in these calculations and it represents the strength of the focusing action of the magnetic dipole to the particle momentum, and it is convenient because it contains both the field strength and the energy of the particles. It is convenient to denote this by a new symbol M so that the differential equation becomes $$r'' + \frac{M^2}{z^6} r = 0$$

This equation has a known solution (Abramowtiz and Stegun, 1970) which can be written as a linear combination of two Bessel functions $$r = \left\{ AJ_{\frac{1}{4}}\left(\frac{M}{2z^2}\right) + BJ_{-\frac{1}{4}}\left(\frac{M}{2z^2}\right) \right\} \sqrt{z}$$

where A and B are arbitrary constants. One can appreciate the meaning of these two solutions by looking at their values as $z \to \infty$ $$J_{\frac{1}{4}}\left(\frac{M}{2z^2}\right) \to \left(\frac{M}{4z^2}\right)^{\frac{1}{4}} \cdot \frac{1}{\Gamma\left(\frac{5}{4}\right)} = \frac{1}{\sqrt{z}} M^{\frac{1}{4}} \times 0.780$$

$$J_{-\frac{1}{4}}\left(\frac{M}{2z^2}\right) \to \left(\frac{4z^2}{M}\right)^{\frac{1}{4}} \cdot \frac{1}{\Gamma\left(\frac{3}{4}\right)} = \sqrt{z} \, M^{-\frac{1}{4}} \times 1.154$$

and then obtain the two asymptotic solutions:

$$r_0 = AM^{\frac{1}{4}} \times 0.780$$

$$r_0 = BM^{-\frac{1}{4}} \times 1.154 \, z$$

The first solution represents a ray parallel to the axis at $z=\infty$ because there is no dependence on z. The second one represents a ray which is initially directed towards the dipole. They correspond to the conventional g and h rays. Considering the case where the incident electron beam is parallel to the axis when it is far away from the dipole, the primary interest in the first to these two solutions. It is then convenient to use this asymptotic expression to fix the value of A and then the solution can be written as $$r = 1.28 \, r_0 \frac{z^{-\frac{1}{2}}}{M^{-\frac{1}{4}}} \cdot J_{\frac{1}{4}}\left(\frac{M}{4z^2}\right)$$

The first zero of $J_{1/4}$ provides the position of the focus which occurs at $$z = 0.424\sqrt{M}$$

and at this point the focal length is given by $$f = 0.193\sqrt{M}$$

The numerical values given here were obtained from the tabulated properties of the Bessel function.

5.2.2 Aberration Coefficients

One can calculate $C_s$ using the general expression $$C_s = -\frac{1}{16\alpha^4} \int r^4 \left[ U^4 + 2U'^2 + 4UU'\left(\frac{r'}{r}\right) + 4U^2\left(\frac{r'}{r}\right)^2 \right] dz \quad (2)$$

where $\alpha$ is the slope of the trajectory at the focus and the integral is performed from infinity to the position of the focus. Inserting the analytical expressions for r and U into this integral indicated that $C_s/f$ should be a constant, and the analytical functions were integrated numerically to give the result $$\frac{C_s}{f} = -0.214$$

Similarly the integral for the coefficient of chromatic aberration $$C_c = \frac{1}{\alpha^2}\int\frac{r^2 U^2}{4}dz$$

is such that $C_s/f$ is expected to have a constant value $$\frac{C_c}{f} = 0.558$$

It is of some interest to note that these simple expressions are universal and give the complete first order focal properties. Specifically, if magnetic dipole of moment $\mu$ is used in order to focus particles of rigidity R one can define a normalized moment $M=\mu/R$ and then the particles will focus at $$z = 0.424\sqrt{M}$$

with a focal length $$f = 0.193\sqrt{M}$$

The coefficient of spherical aberration is $$C_s = -0.0413\sqrt{M}$$

and the coefficient of chromatic aberration is $$C_c = 0.100\sqrt{M}$$

This is a result which contrasts strongly with comparable expressions for other lenses where a distinction must be made between weak lenses which have equally simple expressions, and strong lenses for which no general expression exists. This is particularly striking in the case of $C_s$ which is generally proportional to $f^3$ for weak lenses and is more nearly proportional to f for strong lenses. The uniform magnetic field is the only other example which produces such simple and uniform expressions.

5.2.3 Ray Tracing Calculations

The inventor has performed ray tracing calculations to provide additional confirmation of the numerical values obtained above. The ray tracing program was used to follow the trajectory of an electron in the field of a dipole with normalized moment M from a point on axis at z=−0.1 m and the position of the first focus was obtained. This ray was chosen because the use of an initial ray parallel to the axis caused some instabilities due to the fact that the magnetic field, although small at large distances, never reaches zero. The calculation was performed for various values of the parameter M although only one is really needed because all relevant quantities are independent of M.

Table 1 summarizes the results of two such calculations using two widely differing values of M. In each case the four columns are the direct result of the calculation and the results can be compared with the various predictions given below. The predicted values are in parentheses.

TABLE 1

| M | z | f | $C_s/f$ | $C_c/f$ |
|---|---|---|---|---|
| 0.25 | .0669(.067) | .0302(.0305) | −0.215(.214) | .556(.558) |
| .250 | 0.211(.212) | .0966(.0965) | −0.211(.214) | .545(.558) |

It is evident that the two methods agree very well. The values of $C_s/f$ and $C_c/f$ are considerably lower than those of conventional lenses ($C_s/f \sim 0.4$, $C_c/f \sim 1$) which makes the magnetic dipole a suitable alternative to conventional lens designs.

5.3 Example 3

Lens Apparatus Comprising a Magnetized Sphere

This example relates to the use of permanent magnets in fabrication of dipole magnetic lens apparatus.

It is quite possible and indeed it is very simple to manufacture a sphere of magnetic material which is permanently magnetized along one diameter. This can be done using material such as AlNiCo™ or any of the more modern materials which are commercially available such as the rare-earth magnets of which samarium-cobalt is typical. The fabrication of such materials are well-known to those of skill in the art. They can be made in a variety of forms and it is presumed the manufacturing of them in the form of small spheres is a straightforward matter. With regard to the magnetic field strength which could be obtained in this way, it should be pointed out that a magnetized sphere has a large demagnetization field and therefore the full saturation value of the material cannot be reached. However, calculations indicated that it was possible to obtain a magnetic field strength of about 0.3 Tesla at the surface of a sphere. Thus, the magnetized sphere lens apparatus is quite adequate for focusing a beam of low energy electrons as described herein.

One advantage of this lens design is that a lens made in this manner requires no external power supply, is inherently very stable, cheap to manufacture, and readily available using fabrication methods known to those of skill in the art. It can be made in a variety of sizes to suit the particular application. Although one disadvantage is that the magnetic field strength is not easily adjustable and only useful over a particular range of electron beam energies, this limitation is readily overcome by supplying a variety of different sizes of lenses which can be moved under the specimen. Different sizes of spheres which could be placed under the specimen to provide a lens which could be adjusted in steps corresponding to the size of the sphere which was being used at the time.

Figure 6:
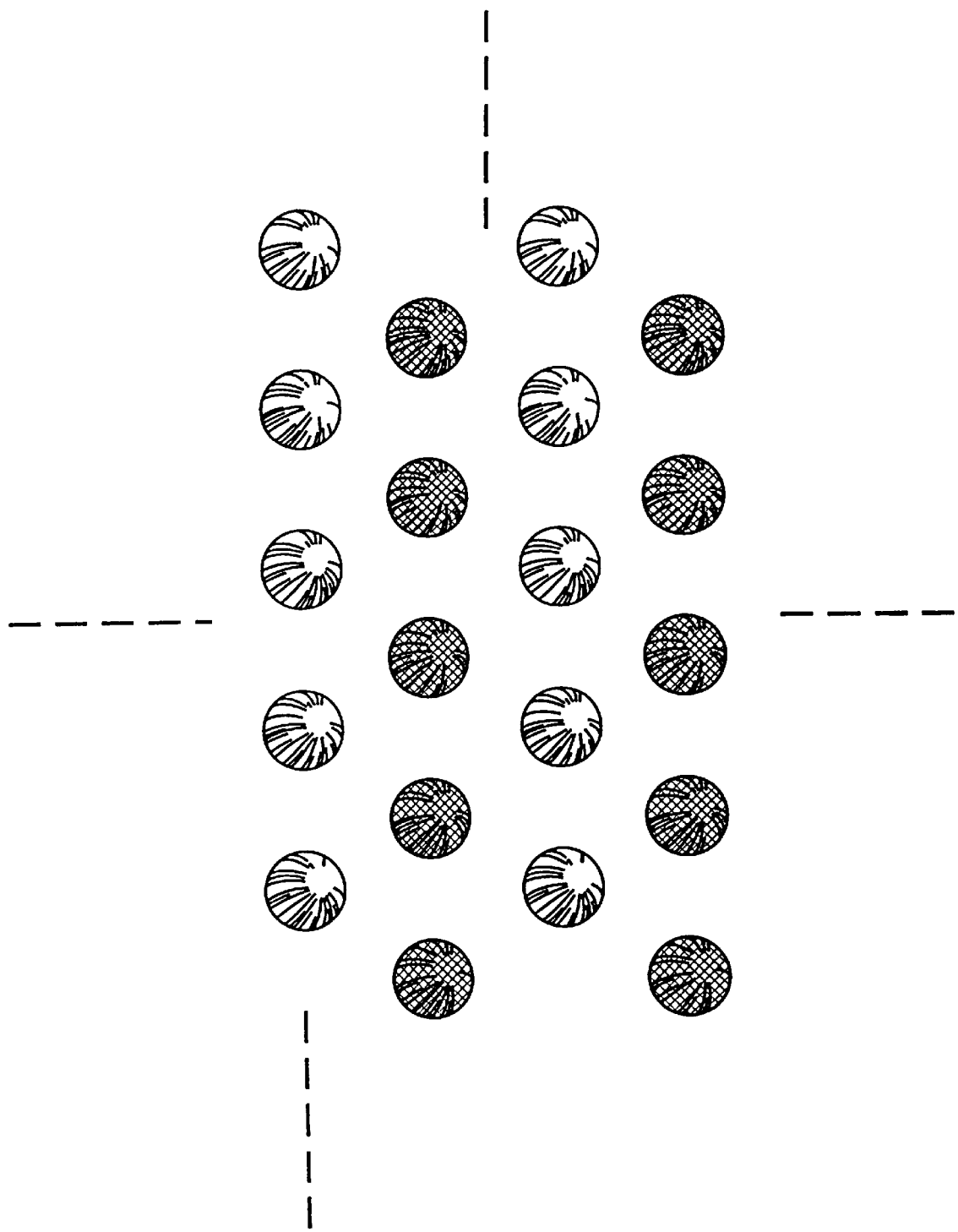

Using the lens apparatus described, it is now possible to fabricate an array of magnetized spheres so that multiple electron beams could be focused simultaneously. A suitable number of spheres are arranged in the form of a lattice (FIG. 6). In one embodiment, alternate rows of spheres are arranged to have alternate polarities. For example, a row with a magnetic field pointing up next to a row with a magnetic field pointing down. By doing this it would obviate the problem of producing a large external field. Since the effective of neighboring spheres would cancel out at some large distance. Such an arrangement is shown in FIG. 6.

Permanent magnet dipoles in the simplest form may consist of magnetized spheres, or similarly-fabricated permanently-magnetized dipoles. The focal point, which is obtained from the calculations above, is where the specimen would be located and it could also be considered to indicate the maximum possible radius of a magnetized sphere which represents the dipole.

Practical values for the dipole moment can be estimated from the saturation value for the particular type of permanent magnet material.

If a sphere of radius ρ is fabricated, then the ideal dipole moment of a fully saturated and uniformly magnetized sphere would be $$\mu = I \cdot \frac{4}{3}\pi\rho^3$$

where I is the saturation value of the magnetic moment per unit volume although in practice a permanent dipole may have a lower value due to the demagnetization factor. However, the inventors assume a saturation value of 1 Tesla to obtain $$\mu = 0.33\rho^3 \cdot T$$

5.4 Example 4
Lens Apparatus Comprising a Superconducting Coil

This example describes the fabrication of a dipole using a superconducting coil. An alternative way to produce a magnetic dipole is to use a circular loop of electric current. This cannot be done under normal circumstances but is very easily accomplished if one uses a superconductor since it is quite possible to start the current flowing in a superconducting ring. Once a current is flowing, it will flow forever as long as the material remains superconducting.

The fabrication of superconducting materials is well-known to those of skill in the art. Various low temperature superconductors such as $Nb_3Sm$, $Nb_3Ge$, and $Nb_{0.4}Ti0.6$ may be used to fabricate the superconducting coils of the invention, and these superconductors may be cooled to liquid Helium temperatures. $Nb_3Sm$, $Nb_3Ge$, and $Nb0.4Ti_{0.6}$ magnet coil technologies are well established. Magnetic coils made of these materials can generate magnetic fields higher than 10 T at liquid He temperature (4.2 K).

Alternatively, high-temperature superconductors, such as $YBa_2Cu_3O_7$ and $Tl_2Ba_2Ca_2Cu_3O_{10}$ may also be used to fabricate the superconducting coils of the invention, and these superconductors may be cooled to liquid nitrogen temperatures or below. High-temperature $YBa_2Cu_3O_7$, $Tl_2Ba_2Ca_2Cu_3O_{10}$, and other copper oxide superconductor coils may readily be prepared having diameters in the millimeter ranger or larger (Sheng and Hermann, 1988). In one example, bulk superconductors may be made first, and then the superconductor bulk material may be machined into suitable ring-shaped coils. Alternatively, the raw materials may be pre-pressed into ring shape coils, and then sintered at high temperature to make them superconducting. Magnetic coils made of these materials can generate magnetic fields higher than 10 T at liquid $N_2$ temperature (77 K) (Paranthaman et al., 1994). The methods for ring magnetization are well-known in the art, and are known as flux-trapping processes. In general, rings are put into high magnetic fields when they are in their normal state, and then during cooling they go through superconducting transition within the magnetic field. Once removed from the field, significant magnetism is retained within the superconducting rings, and as such, the rings become magnets.

Superconductors prepared by either method may be made into coil configuration with two open ends for providing external current. Alternatively, donut-shaped closed rings may be fabricated with the rings being magnetized prior to use. When desirable, rings of differing sizes may be fabricated so as to provide coils of varying field strengths. One or more coils may be used in the practice of the invention according to the particular application.

Figure 7A:
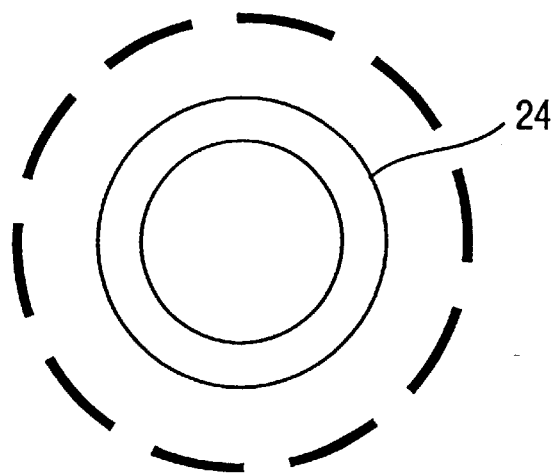

In the fabrication of a superconducting lens apparatus, a substrate, such as silicon, is prepared with either a single superconducting ring or a plurality of such rings. These rings (FIG. 7A) may be made from any of the superconducting materials described above, and may be cooled to suitable temperatures using cooling jackets, or probes which are well-known in the art. In essence almost any such cooling device could be used in the regular practice of the invention so long as adequate cooling is provided for the superconducting coils to remain properly cooled and superconducting. In a preferred embodiment, the rings may be made using any of the newer high $T_c$ superconducting materials, as these high $T_c$ materials have the particular advantage that they can operate at liquid nitrogen temperatures. The use of liquid nitrogen probes to cool specimen holders and specimen stages is wide-spread in the field of electron microscopy and suitable modifications are readily apparent to those of skill in the art to fabricate a means for cooling the superconducting lens apparatus. Similar results may be achieved when cooling a single lens apparatus or multiple lens apparatus within a single device.

Figure 7B:
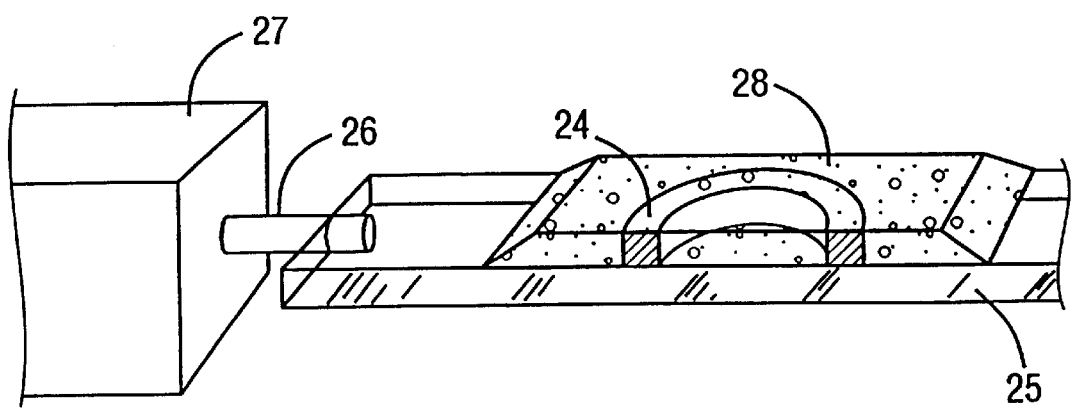

In the case of the superconducting coils described herein, it is generally preferable to cover or embed these superconductors in an external coating of electrically-conducting material so that if any accidental warm-up on the system occurs and the material reverts to its normal conducting state, the energy would be dissipated in this protective layer and the superconductor would remain viable. An illustrative embodiment of a superconducting coil embedded in a suitable coating is indicated in FIG. 7B. The inventors contemplate that magnetic field strengths of about 10 Tesla are obtainable using such superconducting devices.

To calculate the dipole moment of a superconducting ring, the following equation is applied:

$$\mu = \sqrt{\frac{\mu_0 \pi}{4}} I\rho^2 = 9.93 \times 10^{-4} I\rho^2$$

and we might estimate a maximum current density of j=100 $Am^{-2}$ in the superconductor so that if one considers an annulus of inner radius r, outer radius 2 r and thickness r the limiting dipole moment would be approximately $$\mu \leq \rho^3 r\sqrt{\pi^3 \mu_0} \cdot 100 = 0.624\rho^3 rTm^{-3}$$

There is also a limit to the strength of the magnetic field in the dipole which might be estimated to be 10 T and in that case have $$\mu \leq \sqrt{\frac{\pi^3}{\mu_0}} \rho^3 \cdot 10 = 4.97 \times 10^4 \rho^3 Tm^{-2}$$

at the maximum current density.

These results, using these assumptions, indicate that for very small values of ρ (<100 μ), the permanent magnet dipole has the largest dipole moments. For larger values of ρ, the superconducting ring has the largest values of dipole moment. In the range 100 μ<ρ1 mm, the limiting value for the magnetic moment is set by the current density and for ρ>1 mm, it is the magnetic field which sets the limit.

To consider the range of accelerating voltages which could be focused by these dipoles, one may equate the values of z obtained in the first order calculations to ρ, the characteristic physical radius of the dipole. Then $$\rho = 424\sqrt{\frac{\mu}{3.37\sqrt{V}}}$$

or $$V = 2.8\frac{\mu^2}{\rho^4}$$

For the magnetic sphere in Example 3, this gives $$V = \leq (3.5 \times 10^8)\rho^2$$

while for the superconducting ring of the present example (field limited) it gives $$V = (7 \times 10^{10})\rho^2$$

It is of some interest to use these various equations to estimate the performance of an SEM. The inventors first consider an instrument in the usual voltage range of 30 kV. For this case the superconducting ring gives the smallest value of ρ, namely 0.65 mm which in turn implies $C_s$~166 μm and δ~0.76 nm.

Figure 8A:
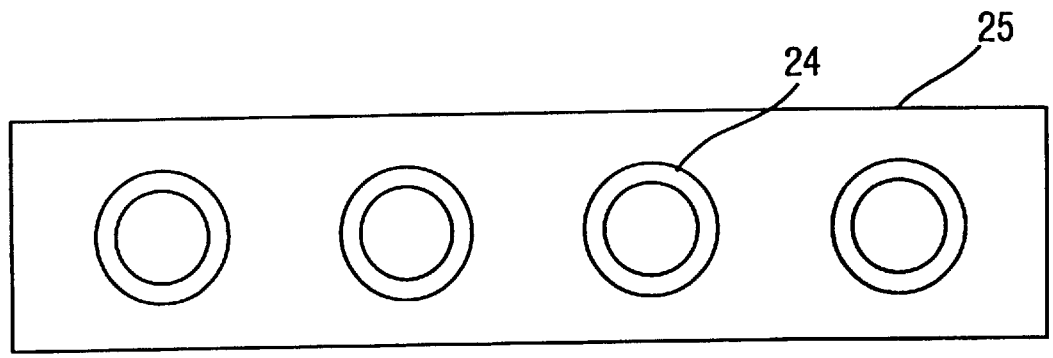
Figure 8B:
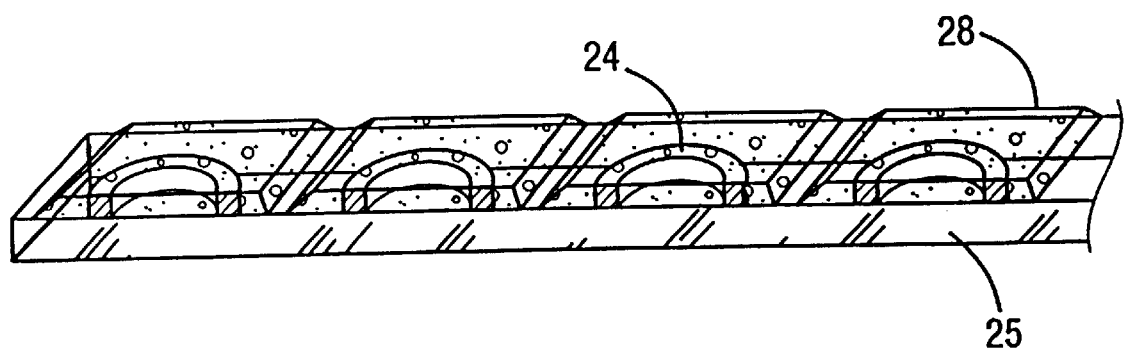

One of the advantages of this lens design is that the strength of the dipole may be readily established and may be preset over a range of values. The superconducting rings may be fabricated in a variety of sizes, and may even be manufactured using relatively inexpensive lithographic etching techniques. Lens apparatus of this design also find particular utility in fabricating lens arrays comprising multiple lenses (FIG. 8). Extending the design to encompass an array of superconducting rings on a single lattice is straightforward, and is diagrammed in FIG. 8.

Although the entire lens or lens array would have to be kept at liquid helium temperatures (in the case of niobium) or liquid nitrogen temperatures (in the case of high $T_c$ materials), such a design would also facilitate cooling of the adjacent specimen as well. This would be particularly advantageous which observing specimens which must be kept cooled.

While the strength of such a lens is not readily adjustable, just as in the case of the magnetized sphere (Example 2) it is possible to provide lenses of different sizes and different strengths so that an appropriate one could be chosen for the particular application and the particular electron beam energy which is being used at the time.

While the lens designs disclosed may be useful in a variety of SEM applications, the inventors contemplate that maximum performance may be obtained with very thin specimens such that the working distance (lens surface to specimen plane) is very small.

5.5 Example 5
Lens Apparatus Comprising a Magnetizable Sphere Within a Coil

This example relates to a lens design which employs a magnetizable sphere within a conventional or superconducting coil. The apparatus described here utilizes one or more of the energized coils described above in combination with single or multiple magnetizable spheres within the field of the superconducting coil. Such lenses may be used either singly, or alternatively, a plurality of such lenses may be used to simultaneously or consecutively focus a plurality of charged particle beams.

FIG. 9A shows the lines of magnetic flux around a conventional energized coil. FIG. 9B illustrates a lens apparatus based on a magnetic dipole which comprises a sphere of normal magnetic iron such as Permadur or even soft iron contained within an external magnetic field of lower strength. The effect of placing a high permeability iron in a weak magnetic field is that the magnetic flux is concentrated onto the high permeability material and drawn away from its normal path. If this high permeability material is in the form of a sphere, then it becomes uniformly magnetized as a perfect magnetic dipole. Thus, the lens apparatus employs a magnetic sphere contained within an energizeable coil which produces a small magnetic field. In a preferred embodiment, the magnetizable sphere is of about 1 mm in diameter and is placed in an about 1-cm diameter weak magnetic field. The strength of the resulting magnetic field near to the sphere would be approximately one hundred times that which would exist if the sphere were not within the energized coil. It can be seen that substantial field concentrations can be obtained in this way. This is indicated schematically in FIG. 9B.

One advantages of this lens apparatus is that standard lens design techniques can be used for the production of the external magnetic field and that this field can be varied at will and therefore the strength of the magnetic dipole can be varied to suit the particular application. Another advantage is that it is quite possible to use a number of spheres inside a common magnetic field (FIG. 10) so that they are all magnetized equally and these can be arranged as an array of the type mentioned above. Alternatively, a lattice may be constructed containing multiple coils each surrounding one or more individual spheres (FIG. 11). In this arrangement different coil strengths may be utilized to create lenses which have differing focusing abilities.

5.6 Example 6
Lens Apparatus Comprising a Magnetizable Needle Within a Coil

In a fashion similar to those described for the invention of the magnetic dipole lenses described in Examples 2–5, the inventor also determined that a magnetic monopole should also make an excellent focusing lens for a charged particle beam when placed below the target, if such a lens were practical to fabricate.

While it is well-known that a true magnetic monopole does not exist, the inventor reasoned that it was possible to make a lens design comprising a virtual monopole—a system where one pole is very close to the point of usage while the other pole is so far away that it has little or no influence. With these considerations in mind, the inventor developed novel lens apparatus which employed a virtual magnetic monopole. One such lens apparatus comprising a needle within a conducting coil is described in this example.

It is known that a long magnetized needle may be used as an approximation to a dipole. By long needle, the inventor means a rod of some kind whose length is considerably greater than its diameter, say ten or more times. It is also well known in the art that a permanently magnetized needle of this kind suffers from the difficulty that the effective position of the pole is not at the end of the rod as might be imagined, but in some distance back into the material. This effect is due to the large demagnetization factor for a needle and is simply a geometric issue. However, this problem disappears if a magnetic material is used which is not permanently magnetic and if an external coil is used in order to magnetize the needle. So, for example, if in FIG. 10, the sphere is replaced with a long needle whose axis is along the magnetic field, then that needle will become magnetized and each end of it will appear to be a good approximation to a monopole and this can then be used as a focusing device for an electron beam. The resulting lens design is shown in FIG. 12.

As in the case of the previous lens apparatus disclosed herein, the magnetizable needle contained within a conducting coil may also be used in the fabrication of multiple lens arrays (FIG. 13). In one such embodiment, a single common magnetic field surrounds an array of needles inside the coil such that each one becomes a dipole and each one of them can then act as an independent lens for focusing electrons. Alternatively, another embodiment features multiple field coils each containing one or more magnetizable needles to produce multiple arrays each having the ability to be energized variably to produce lenses capable of focusing differently-energized electron beams (FIG. 14).

With regard to the field strength which can be obtained with either the sphere or the needle described in herein or in Example 5, one would expect to achieve fields approaching the saturation value of the material chosen. Thus a field strength of about 2 Tesla would be readily achieved in these lens apparatus.

Such lenses would be particularly applicable to the field of lithography, since various sized needles could readily be used to prepare lithographic etching probes of various diameter and intensity. The small size of the lenses would facilitate the use of multiple arrays comprising a plurality of lens apparatus to simultaneously produce probes having such differing diameters and field intensities. The inventor further contemplates that a combination of the needle- and sphere-containing lenses described herein could also be used in a variety of processes including those mentioned for electron microscopy and lithography. In fact, the only limitation seen by the inventor in the number of lenses and combination of lens types which may be combined to produce a lens array would be those of a practical nature, wherein the ultimate size of the lens array or ultimate number of energized coils would be limited by spatial, manufacturing, or fabrication considerations. As such, all combinations of the lens apparatus disclosed herein, either alone or in lens arrays, lattices, or other pluralities are all considered to fall within the scope of the present invention.

While the description of the preferred embodiments of the present invention are disclosed herein, it should be appreciated by those of skill in the art that the techniques and apparatus discovered by the inventor to function well in the practice of the invention can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

All of the apparatus and methods disclosed and claimed herein can be made and executed without undue experimentation in light of the present disclosure. While the apparatus and methods of this invention have been described in terms of illustrative embodiments, it will be apparent to those of skill in the art that variations may be applied to the apparatus, methods and in the steps or in the sequence of steps of the method described herein without departing from the concept, spirit and scope of the invention. More specifically, it will be apparent that certain components which are either mechanically, physically, or structurally related may be substituted for the components described herein while the same or similar results would be achieved. All such similar substitutes and modifications apparent to those skilled in the art are deemed to be within the spirit, scope and concept of the invention as defined by the appended claims.

6. REFERENCES

The references listed below and all references cited herein are incorporated herein by reference to the extent that they supplement, explain, provide a background for, or teach methodology, techniques, and/or compositions employed herein.

U.S. Pat. No. 3,870,891.
U.S. Pat. No. 4,392,058.
U.S. Pat. No. 4,419,581.
U.S. Pat. No. 4,918,318.
U.S. Pat. No. 5,241,176.
Abramowitz, M. and Stegun, I. A., Eds.: Handbook of Mathematical Functions, Dover Publications, Inc., Ninth Printing, New York, p. 362, 1970.
Crewe, A. V., "A New Characterization of the Magnetic Lens," Optik, 89:70, 1991.
Crewe, A. V., "Is there a limit to the resolving power of the SEM?" Proc. 11th Intl. Congr. Electr. Microscop. 3:2105–2108. Kyoto, 1986.
Crewe, A. V., "Limits of electron probe formation," J. Micro. 178:93, 1995.
Crewe and Parker, "Correction of third order aberrations in the scanning electron microscope," Optik: 183–194, 1976.
Kanaya and Ono, "Interaction of Electron Beam with the Target in Scanning Electron Microscope," In: Electron Beam Interactions with Solids, p. 69–98, Chicago, Ill.
Mulvey, T. "Magnetic Electron Lenses," Ed. P. W. Hawkes, Springer-Verlag, New York, p. 390, 1982.
Mulvey, "Unconventional Lens Design," In: Magnetic Electron Lenses, ed. P. W. Hawkes, p. 391. Springer-Verlag, Berlin, 1982.
Nagatani, T. and Saito, S., Instrumentation for ultra high resolution scanning electron microscopy. Proc. 11th Intl. Congr. Electr. Microscop. 3:2101–2104. Kyoto, 1986.
Nakagawa, S., "Magnetic Objective Lens for Use in a Scanning Electron Microscope," U.S. Pat. No. 4,419,581, 1983.
Paranthaman, M., H. M. Duan, and A. M. Hermann, "Thallium-Based High-Temperature Superconductors' edited by A. M. Hermann and J. V. Yakahmi, Marcel Dekker, Inc., New York, 1994, p. 177.
Sheng, Z. Z. and A. M. Hermann, Nature, 332, 55 (1988).
Takashima, S., "New Electron Optical Technologies in Low Voltage Scanning Electron Microscope," JEOL News, 31E(1):33–35, 1994.
Yonezawa, A., "Scanning Electron Beam Microscope with High Resolution at Low Accelerating Voltage," U.S. Pat. No. 5,241,176, 1993.

What is claimed is:

1. A charged particle beam apparatus, comprising:
   (a) a source that emits a beam of charged particles along a given axis during use; and
   (b) a lens comprising at least one permanent magnet which produces a magnetic field approximating that of a magnetic dipole, the magnet further defined as sufficient to resolve a beam of charged particles having an energy of about 1,000 eV to a resolution of less than about 4 nm during use; wherein said lens focuses said beam of charged particles to a target position on the axis between said source and said lens.

2. The apparatus of claim 1, wherein said magnet comprises AlNiCo™.

3. The apparatus of claim 1, wherein said magnet is a rare earth magnet.

4. The apparatus of claim 1, further defined as comprising an array of permanent magnets.

5. The apparatus of claim 4, wherein said array of permanent magnets is adapted to focus multiple electron beams during use.

6. The apparatus of claim 1, wherein said charged particle beam comprises comprising an energy of from about 100 eV to about 50,000 eV.

7. The apparatus of claim 6, wherein said charged particle beam comprises an energy of from about 1000 eV to about 30,000 eV.

8. The apparatus of claim 7, wherein said charged particle beam comprises an energy of from about 5000 eV to about 20,000 eV.

9. The apparatus of claim 1, wherein said magnet is sufficient for resolving a beam of charged particles having an energy of about 1,000 eV to a resolution of less than about 1 nm during use.

10. The apparatus of claim 1, wherein said beam of charged particles comprises electrons.

11. The apparatus of claim 1, wherein said charged particle beam apparatus is an electron microscope or a scanning electron microscope.

12. The apparatus of claim 1, wherein said charged particle beam apparatus comprises a lithographic etching-probe.

13. The apparatus of claim 1, comprising a plurality of lenses.

14. The apparatus of claim 13, wherein said plurality of lenses is adapted to image a single specimen or multiple specimens during use.

15. The method of claim 1, wherein the magnet is sufficient to resolve a beam of charged particles having an energy of about 1,000 eV to a resolution of between 0.5 and 2 nm during use.

16. A charged particle beam apparatus, comprising:
(a) a source that emits a beam of charged particles comprising an energy of from about 100 eV to about 50,000 eV along a given axis during use; and
(b) a lens comprising at least one permanent magnet, the magnet further defined as sufficient to resolve a beam of charged particles having an energy of about 1,000 eV to a resolution of less than about 4 nm during use; wherein said lens focuses said beam of charged particles to a target position on the axis between said source and said lens.

17. The apparatus of claim 16, wherein said magnet comprises AlNiCo™.

18. The apparatus of claim 16, wherein said magnet is a rare earth magnet.

19. The apparatus of claim 18, wherein said rare earth magnet is samarium-cobalt.

20. The apparatus of claim 16, wherein said lens achieves a magnetic field strength of about 0.3 Tesla.

21. The apparatus of claim 16, further defined as comprising an array of permanent magnets.

22. The apparatus of claim 21, wherein said array of permanent magnets focuses multiple electron beams simultaneously during use.

23. The apparatus of claim 22, wherein said array of permanent magnets focuses multiple electron beams consecutively during use.

24. The apparatus of claim 21, wherein said array of permanent magnets form a lattice array.

25. The apparatus of claim 24, wherein said lattice array has alternate polarities.

26. The apparatus of claim 25, wherein said lattice array comprises:
a row of permanent magnets having magnetic fields pointing up; and
a row of permanent magnets having magnetic fields pointing down.

27. The apparatus of claim 16, wherein said magnet has a spherical geometry.

28. The apparatus of claim 16, wherein said magnet has a non-spherical geometry.

29. The apparatus of claim 16, wherein said magnet produces a dipole.

30. The apparatus of claim 16, wherein said charged particle beam comprises an energy of from about 1000 eV to about 30,000 eV.

31. The apparatus of claim 30, wherein said charged particle beam comprises an energy of from about 5000 eV to about 20,000 eV.

32. The apparatus of claim 16, further comprising a holder fixedly connected to said lens perpendicular to the long axis of the lens at its uppermost end, said holder being adapted for receiving a specimen during use.

33. The apparatus of claim 16, wherein said magnet is sufficient for resolving a beam of charged particles having an energy of about 1,000 eV to a resolution of less than about 1 nm during use.

34. The apparatus of claim 16, wherein said beam of charged particles comprises electrons.

35. The apparatus of claim 16, further comprising a device for cooling said lens.

36. The apparatus of claim 16, wherein said device comprises a liquid nitrogen or liquid helium probe contacting said lens.

37. The apparatus of claim 16, wherein said charged particle beam apparatus is an electron microscope or a scanning electron microscope.

38. The apparatus of claim 16, wherein said charged particle beam apparatus comprises a lithographic etching-probe.

39. The apparatus of claim 16, comprising a plurality of lenses.

40. The apparatus of claim 39, wherein said plurality of lenses can image a single specimen during use.

41. The apparatus of claim 39, wherein said plurality of lenses can image multiple specimens during use.

42. The apparatus of claim 41, wherein said plurality of lenses can consecutively image multiple specimens during use.

43. The apparatus of claim 41, wherein said plurality of lenses can simultaneously image multiple specimens during use.

44. The method of claim 16, wherein the magnet is sufficient to resolve a beam of charged particles having an energy of about 1,000 eV to a resolution of between 0.5 and 2 nm during use.

45. A scanning electron microscope, comprising:
(a) a source that emits a beam of charged particles along a given axis during use; and
(b) a lens comprising at least one permanent magnetic sphere which produces a magnetic field; wherein said lens focuses said beam of charged particles to a target position on the axis between said source and said lens; wherein said magnetic field is sufficient for resolving the beam of charged particles to a resolution of less than about 4 nm.

46. The scanning electron microscope of claim 45, wherein said charged particle beam comprises an energy of from about 100 eV to about 50,000 eV.

47. The scanning electron microscope of claim 46, wherein said charged particle beam comprises an energy of from about 1000 eV to about 30,000 eV.

48. The scanning electron microscope of claim 47, wherein said charged particle beam comprises an energy of from about 5000 eV to about 20,000 eV.

49. The scanning electron microscope of claim 45, wherein the magnet is sufficient to resolve a beam of charged particles having an energy of about 1,000 eV to a resolution of between 0.5 and 2 nm during use.

50. The scanning electron microscope of claim 45, wherein the magnet is sufficient to resolve a beam of charged particles having an energy of about 1,000 eV to a resolution of less than 1 nm during use.

51. A method for producing a beam of charged particles, comprising the steps of:
   (a) providing a source that emits a plurality of charged particles along a given axis, wherein said particles are at an energy of from about 100 eV to about 30,000 eV;
   (b) focusing said plurality of charged particles with a lens to a target position on the axis between said source and said lens, wherein said lens comprises at least one permanent magnetic sphere;

wherein said permanent magnetic sphere produces a magnetic field sufficient for resolving the beam of charged particles to a resolution of less than about 4 nm.

52. The method of claim 51, wherein the magnet is sufficient to resolve a beam of charged particles having an energy of about 1,000 eV to a resolution of between 0.5 and 2 nm during use.

53. The method of claim 51, wherein the magnet is sufficient to resolve a beam of charged particles having an energy of about 1,000 eV to a resolution of less than 1 nm during use.

* * * * *

UNITED STATES PATENT AND TRADEMARK OFFICE
CERTIFICATE OF CORRECTION

PATENT NO. : 6,410,923 B1
DATED : June 25, 2002
INVENTOR(S) : Crewe

It is certified that error appears in the above-identified patent and that said Letters Patent is hereby corrected as shown below:

Column 1,
Line 7, please insert -- The United States Government has certain rights in this invention pursuant to Grant No. DE-FE02-86ER60437 awarded by the Department of Energy. --

Column 31,
Line 2, please delete "comprising".
Line 27, please delete "method" and insert -- apparatus -- therefor.

Column 32,
Line 45, please delete "method" and insert -- apparatus -- therefor.

Signed and Sealed this

Twenty-second Day of April, 2003

JAMES E. ROGAN
*Director of the United States Patent and Trademark Office*